US010418452B2

(12) United States Patent
Wutte et al.

(10) Patent No.: US 10,418,452 B2
(45) Date of Patent: Sep. 17, 2019

(54) SEMICONDUCTOR DEVICE WITH DIFFERENT GATE TRENCHES

(71) Applicant: Infineon Technologies Austria AG, Villach (AT)

(72) Inventors: Britta Wutte, Feistritz (AT); Sylvain Leomant, Pörtschach am W. (AT)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 15/948,651

(22) Filed: Apr. 9, 2018

(65) Prior Publication Data

US 2018/0226481 A1    Aug. 9, 2018

Related U.S. Application Data

(63) Continuation-in-part of application No. 15/374,254, filed on Dec. 9, 2016, now Pat. No. 9,941,354.

(30) Foreign Application Priority Data

Dec. 10, 2015 (DE) .......................... 10 2015 121 497

(51) Int. Cl.
| H01L 29/74 | (2006.01) |
| H01L 31/111 | (2006.01) |
| H01L 29/423 | (2006.01) |
| H01L 29/66 | (2006.01) |
| H01L 29/40 | (2006.01) |
| H01L 29/78 | (2006.01) |

(52) U.S. Cl.
CPC ........ H01L 29/4236 (2013.01); H01L 29/407 (2013.01); H01L 29/4238 (2013.01); H01L 29/66734 (2013.01); H01L 29/7813 (2013.01)

(58) Field of Classification Search
CPC ............ H01L 29/407; H01L 29/42356; H01L 29/66628; H01L 29/7397; H01L 29/7813; H01L 29/66348; H01L 29/7395; H01L 27/0886; H01L 27/0924; H01L 27/10841; H01L 21/76877; H01L 21/76879; H01L 21/823431; H01L 21/823487; H01L 21/823821; H01L 21/823885
USPC ................ 257/135, 220, 263, 302, 330, 331
See application file for complete search history.

(56) References Cited

U.S. PATENT DOCUMENTS

| 8,022,474 B2 | 9/2011 | Haeberlen et al. |
| 8,652,900 B2 | 2/2014 | Hsieh |
| 8,928,066 B2 | 1/2015 | Wutte et al. |

(Continued)

FOREIGN PATENT DOCUMENTS

DE    102014117297 A1    5/2015

*Primary Examiner* — Hsien Ming Lee
(74) *Attorney, Agent, or Firm* — Murphy, Bilak & Homiller, PLLC

(57) ABSTRACT

A semiconductor device includes a first trench and a second trench in a first main surface of a semiconductor substrate. Each of the first and second trenches includes first sections extending lengthwise in a first direction and a second section extending lengthwise in a second direction transvers to the first direction, the second section of the first trench being disposed opposite to the second section of the second trench. The semiconductor device further includes a semiconductor mesa separating the first and second trenches, and a source metal layer above the first main surface of the semiconductor substrate and electrically connected to source regions in the semiconductor mesa. Corresponding methods of manufacture are also described.

19 Claims, 22 Drawing Sheets

(56) References Cited

U.S. PATENT DOCUMENTS

| | | |
|---|---|---|
| 9,385,228 B2 | 7/2016 | Laven et al. |
| 2009/0008709 A1 | 1/2009 | Yedinak et al. |
| 2011/0233665 A1 | 9/2011 | Matsuura et al. |

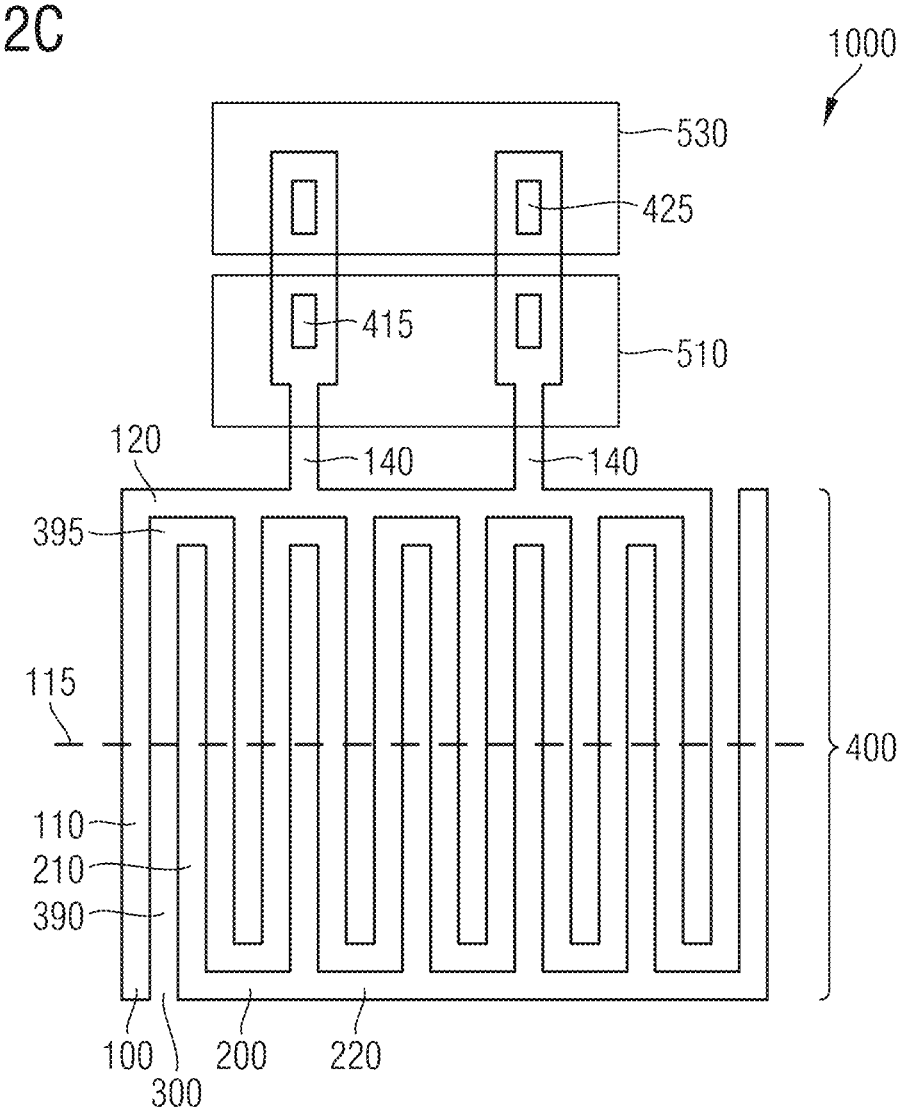

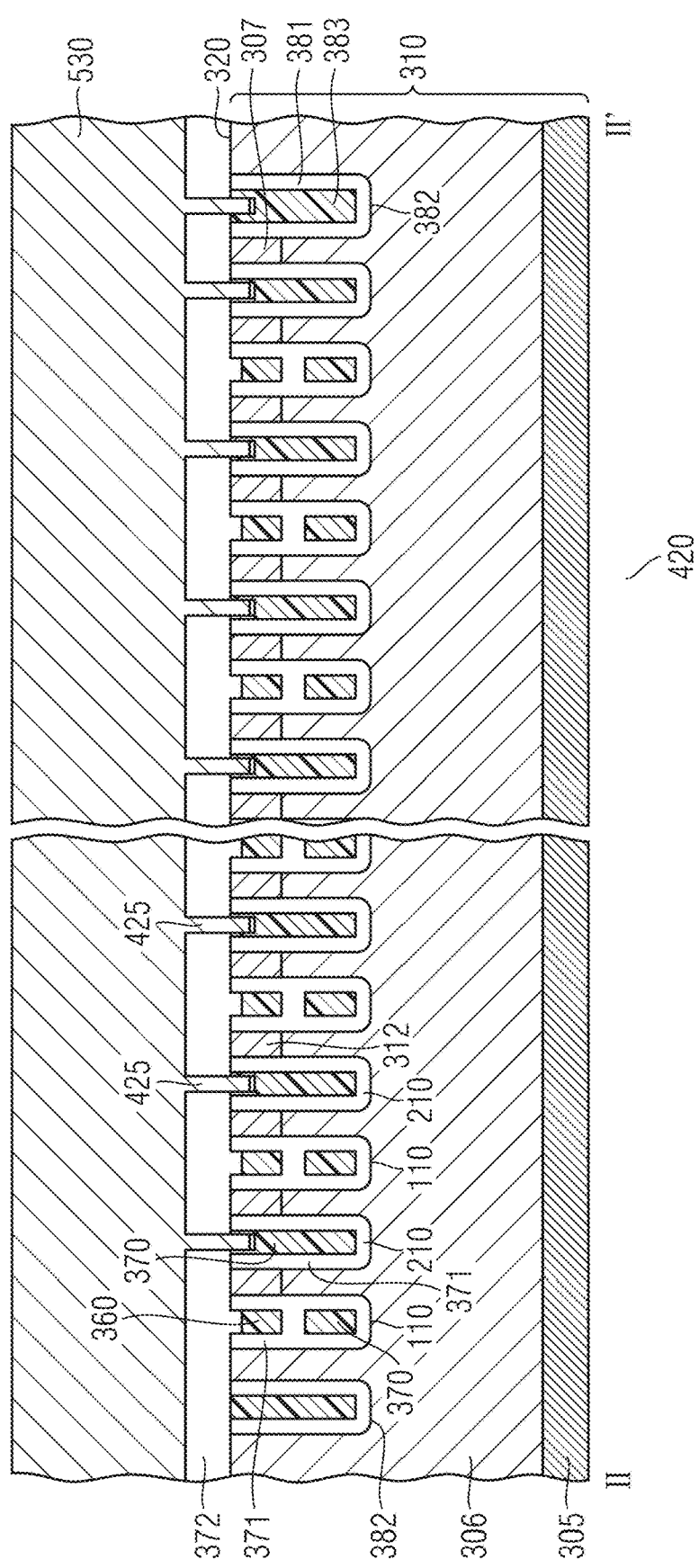

SEMICONDUCTOR DEVICE WITH DIFFERENT GATE TRENCHES

BACKGROUND

Power transistors are commonly employed in automotive and industrial electronics as switches. Generally, such transistors require a low on-state resistance ($R_{on} \cdot A$), while securing a high voltage blocking capability. For example, a MOS (metal oxide semiconductor) power transistor should be capable—depending upon application requirements—to block drain to source voltages $V_{ds}$ of some tens to some hundreds or even thousands of volts. MOS power transistors typically conduct a very large current which may be up to some hundreds of Amperes at typically gate-source voltages of about 2 to 20 V.

In trench power devices, components of the transistors such as the gate electrode are typically disposed in trench structures formed in a main surface of a semiconductor substrate. Such trench power devices typically implement vertical transistors in which a current flow mainly takes place from a first side, e.g. a top surface of the semiconductor substrate to a second side, e.g. a bottom surface of the semiconductor substrate. Charge balanced shielded gate trench MOSFETs (metal oxide semiconductor field effect transistors) are, e.g. used for several DC/DC power conversion applications. In particular, power MOSFETs based on this technology allow to reach a high efficiency by optimizing both conduction and switching losses coming from the power MOSFET itself.

Further investigations are being made for improving trench power MOSFETs.

SUMMARY

According to an embodiment, a semiconductor device comprises a first gate trench and a second gate trench in a first main surface of a semiconductor substrate. A mesa is arranged between the first gate trench and the second gate trench, the mesa separating the first gate trench from the second gate trench. Each of the first and second gate trenches comprises first sections extending in a first direction and second sections connecting adjacent ones of the first sections. The second sections of the first gate trench are disposed opposite to the second sections of the second gate trench with respect to a plane perpendicular to the first direction.

According to a further embodiment, a semiconductor device comprises a first gate trench and a second gate trench in a first main surface of a semiconductor substrate. A mesa is arranged between the first gate trench and the second gate trench and separates the first gate trench from the second gate trench. Each of the first and second gate trenches comprises first sections extending in a first direction and second sections connecting adjacent ones of the first sections. The first sections of the first gate trench are disposed between adjacent ones of the first sections of the second gate trench and vice versa.

According to an embodiment, a semiconductor device comprises a first gate trench and a second gate trench in a first main surface of a semiconductor substrate. A mesa is arranged between the first gate trench and the second gate trench and separates the first gate trench from the second gate trench. The mesa comprises first regions extending in a first direction and second regions connecting adjacent ones of the first regions. The mesa is implemented as a path.

According to further embodiment, a semiconductor device comprises a first trench and a second trench in a first main surface of a semiconductor substrate, each of the first and second trenches comprising first sections extending lengthwise in a first direction and a second section extending lengthwise in a second direction transvers to the first direction, the second section of the first trench being disposed opposite to the second section of the second trench; a semiconductor mesa separating the first and second trenches; and a source metal layer above the first main surface of the semiconductor substrate and electrically connected to source regions in the semiconductor mesa.

According to a further embodiment, a transistor device comprises: a first trench and a second trench arranged in a comb-like structure, first sections of the first and second trenches corresponding to teeth of the comb-like structure and second sections of the first and second trenches corresponding to opposing shafts of the comb-like structure, wherein the arrangement of the first trench and the second trench forms a pattern of interdigitated fingers, wherein transistor cells of the transistor device are disposed between single fingers of the first and second trenches, wherein a semiconductor mesa separates the first trench and the second trench from each other, wherein a gate electrode in the first trench or a gate electrode in the second trench is electrically connected to a source potential instead of a gate potential to decrease a gate charge of the transistor device.

According to a further embodiment, a method of manufacturing a semiconductor device comprises: forming a first trench and a second trench in a first main surface of a semiconductor substrate and separated from each other by a semiconductor mesa, each of the first and second trenches comprising first sections extending lengthwise in a first direction and a second section extending lengthwise in a second direction transvers to the first direction, the second section of the first trench being disposed opposite to the second section of the second trench; forming a source metal layer above the first main surface of the semiconductor substrate, the source metal layer being electrically connected to source regions in the semiconductor mesa; and electrically connecting a gate electrode in the first trench or a gate electrode in the second trench to the source metal layer instead of a gate potential.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 2C shows a schematic horizontal cross-sectional view of a semiconductor device according to one or more embodiments.

FIG. 4B shows a cross-sectional view of the field plate contact area of the semiconductor device shown in FIG. 3.

DETAILED DESCRIPTION

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

Figure 1:
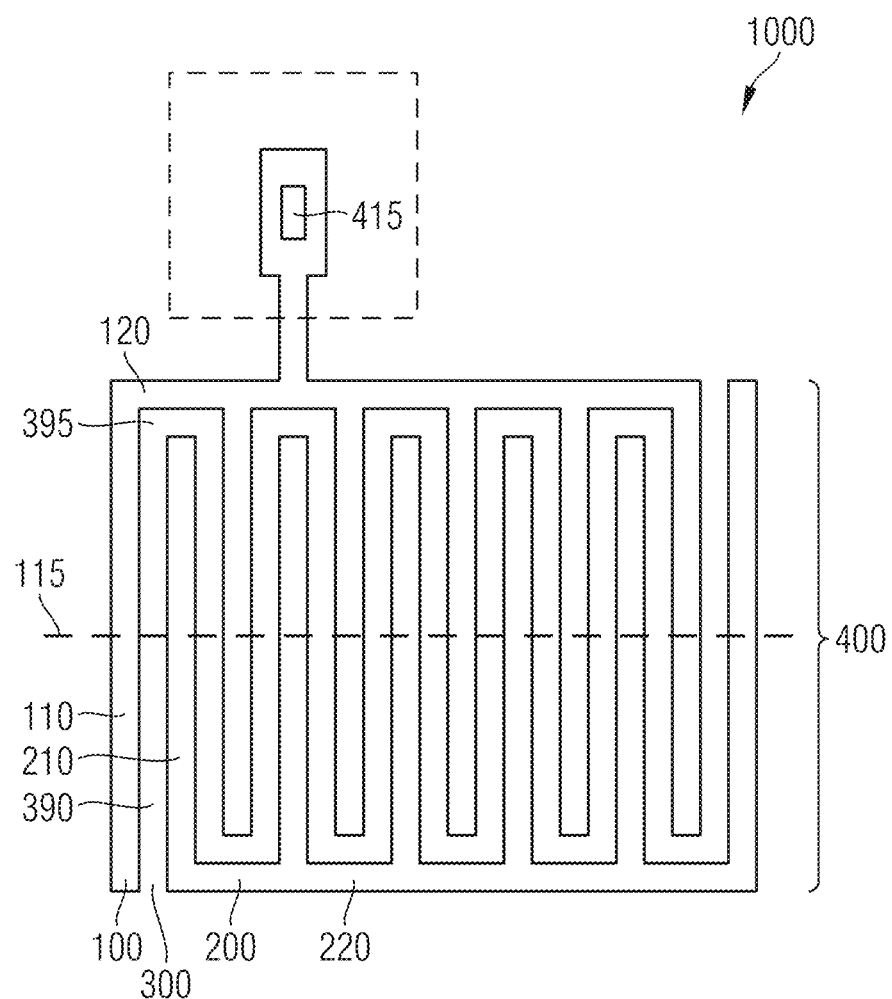
FIG. 1 shows a schematic horizontal cross-sectional view of a semiconductor device according to an embodiment.
Figure 1:
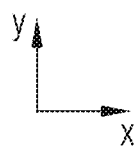

FIG. 1 shows a horizontal cross-sectional view of a semiconductor device 1000 according to an embodiment. The horizontal cross-sectional view is taken in a plane parallel to a first main surface of a semiconductor substrate. The semiconductor device 1000 comprises a first gate trench 100 and a second gate trench 200 in the first main surface of a semiconductor substrate. A mesa 300 is arranged between the first gate trench 100 and the second gate trench 200, the mesa 300 separating the first gate trench 300 from the second gate trench 200. The first gate trench 100 comprises first sections 110 extending in a first direction, e.g. the y-direction and second sections 120 connecting adjacent ones of the first sections 110. The second gate trench 200 comprises first sections 210 extending in the first direction, e.g. the y-direction, and second sections 220 connecting adjacent ones of the first sections 210. The second sections 120 of the first gate trench 100 are disposed opposite to the second sections 220 of the second gate trench 200 with respect to a plane 115 perpendicular to the first direction. For example, the plane 115 may run in a second direction, e.g. the x-direction and may be perpendicular to first main surface of the semiconductor substrate.

As is specifically illustrated in FIG. 1, the first gate trench 100 is separated from the second gate trench 200, i.e. the first gate trench 100 is not connected with the second gate trench 200. In other words, the first sections 110 of the first gate trench 100 are not structurally connected with any of the first sections 210 of the second gate trench 200 or the second sections 220 of the second gate trench 200. Further, the second sections 120 are not structurally connected with any of the first sections 210 of the second gate trench 200 or the second sections 220 of the second gate trench 200. The first and the second gate trenches 100, 200 may be identical in shape or at least a part of the first gate trench 100 and the second gate trench 200 may be identical to each other. The second gate trench 200 may be rotated by 180° in a plane parallel to the first main surface of the semiconductor substrate. The first sections 110 of the first gate trench 100 may be identical with the first sections 210 of the second gate trench 200. The second sections 120 of the first gate trench 100 may be identical with the second sections 220 of the second gate trench 200.

The second sections 120 of the first trench 100 connect adjacent ones of the first sections 110 of the first trench 100. The second sections 220 of the second gate trench 200 connect adjacent ones of the first sections 210 of the second gate trench 200. The second sections 120, 220 may run in a second direction which is perpendicular to the first direction. The second direction may for example be the x-direction. Further, the second sections may have a curved shape. According to further embodiments, the second sections may comprise a straight or linear portion, e.g. linearly extending in the second direction and may have a curved or slanted connection portion to the first sections 110. The first gate trench 100 and the second gate trench 200 are separated from each by means of the mesa 300.

According to an alternative interpretation, the semiconductor device 1000 may comprise a first gate trench 100 and a second gate trench 200 in a first main surface of semiconductor substrate. A mesa 300 is arranged between the first gate trench 100 and the second gate trench 200 and separates the first gate trench 100 from the second gate trench 200. The first gate trench 100 comprises first sections 110 extending in a first direction, e.g. the y-direction and second sections 120 connecting adjacent ones of the first sections 110. The second gate trench 200 comprises first sections 210 extending in the first direction and second sections 220 connecting adjacent ones of the first sections 210. The first sections 110 of the first gate trench 100 are disposed between adjacent ones of the first sections 210 of the second gate trench 200 and vice versa. The first sections 110 of the first gate trench 100 may be parallel to the first sections 210 of the second gate trench 200. As has been discussed above, the second gate trench 200 may be identical to the first gate trench or may have sections which are identical to those of the first gate trench. The second gate trench 200 may be or rotated by 180° in a plane parallel to the first main surface.

For example, the first gate trench 100 and the second gate trench 200 may have a comb-like structure, wherein the first sections 110, 210 correspond to the teeth of the comb whereas the concatenation of second sections 120, 220 corresponds to the shaft of the comb. The first comb implementing the first gate trench 100 and the second comb implementing the second gate trench 200 are inserted into each other or assembled in such a manner that the shaft and outer teeth of the first gate trench and of the second gate trench form the outer contour of the arrangement of first gate trench 100 and second gate trench 200.

The arrangement of the first gate trench 100 and the second gate trench 200 forms a pattern of interdigitated fingers, wherein the transistor cells of the transistor are disposed between the single fingers of the first gate trench 100 and the second gate trench 200.

The mesa 300 separates the first gate trench 100 and the second gate trench 200 from each other. The mesa 300 may be regarded as comprising first regions 390 extending in the first direction and second regions 395 connecting adjacent first regions 390. The mesa 300 is implemented as a path. In the context of the present specification, the term "path" is to be understood as being different from a loop which means that the path has an initial point which is different from a terminal point. In contrast, a loop has an initial point which may be equal to the terminal point of the loop. The mesa 300 forms kind of meander in the first main surface of the semiconductor substrate and continuously extends across the cell array. The first regions 390 may run in the y-direction. The second regions 395 that connect adjacent ones of the first regions 390 may run in the direction which is perpendicular to the first direction, e.g. into the x-direction. According to a further embodiment, the second regions 395 may be curved or slanted or may comprise straight portions and rounded portions. For example, the mesa may have a shape so that a width of the mesa is approximately equal throughout its length.

FIG. 1 further shows a gate contact 415. The gate contact 415 is disposed in a peripheral portion of the semiconductor device 1000. Generally, the semiconductor device 1000 comprises a transistor cell array 400 and a peripheral portion outside the transistor cell array 400. The first gate trench 100 and the second gate trench 200 are assembled so that the outermost first section of the first and second gate trenches 100, 200 and the concatenation of second sections of the first and second gate trenches 100, 200 forms an outer contour of the transistor cell array 400. The gate contact 415 may be arranged outside the cell array 400 and outside the contour formed by the combined first gate trench 100 and second gate trench 200. The gate contact 415 electrically connects the gate electrode to a gate terminal via a gate conductive layer, e.g. a gate metallization layer, as will be explained below.

According to one or more embodiments, the first sections 110 of the first gate trench 100 are disposed at a first pitch, and the first sections 210 of the second gate trench 200 may be disposed at the first pitch. Further, sections 390 of the mesa 300 may be disposed at a second pitch. The sections 390 of the mesa 300 extend in the first direction, e.g. the y-direction. The sections of the mesa separate the first sections 110 of the first trench from the first sections 210 of the second trench. The second pitch may be equal to half the first pitch.

Figure 2A:
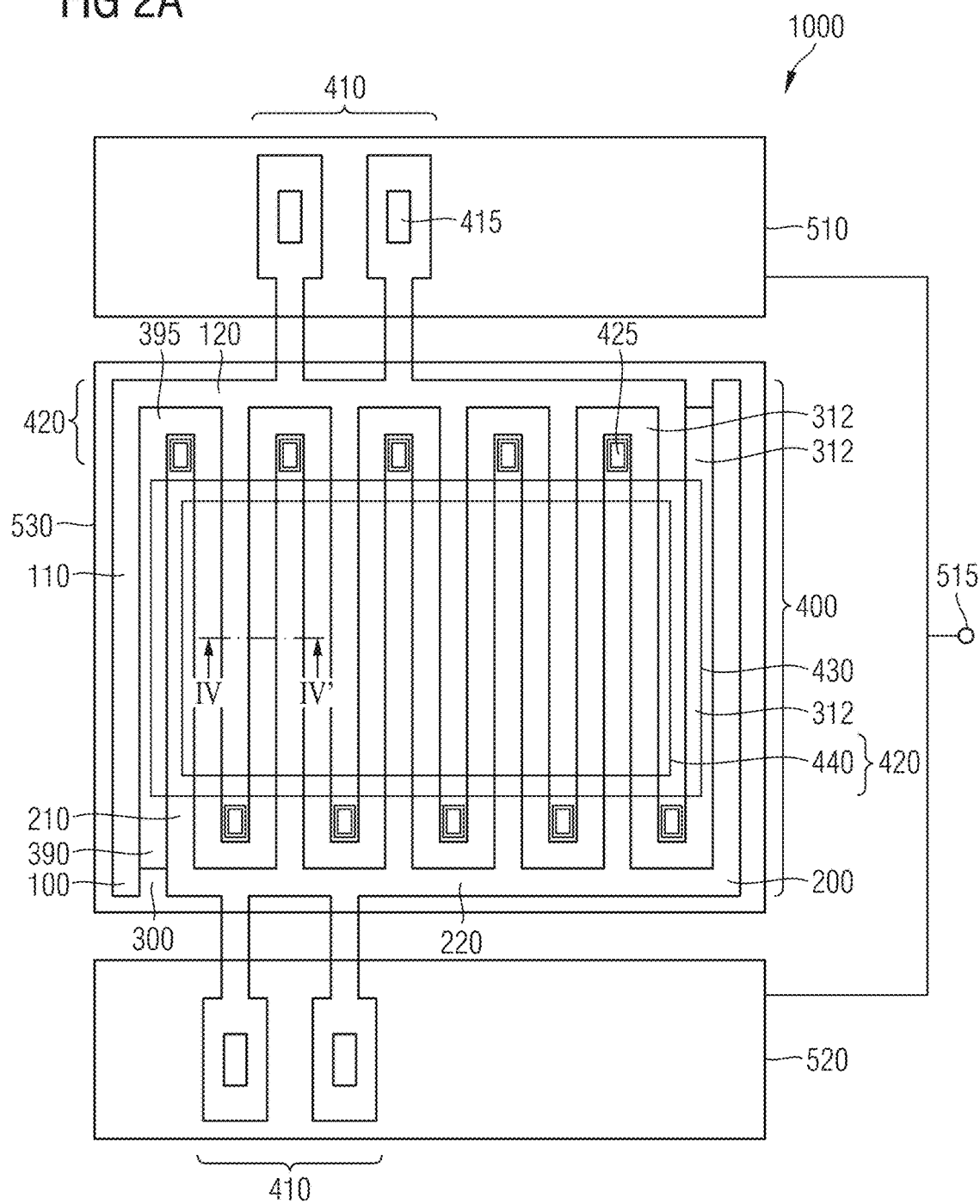
FIG. 2A shows a schematic plan view of a semiconductor device according to an embodiment.

FIG. 2A shows schematic plan view of the semiconductor device 1000. The semiconductor device 1000 comprises a first gate trench 100 and a second gate trench 200 which may have the same shape and structure as illustrated in FIG. 1. The semiconductor device further comprises a mesa 300 arranged between the first gate trench 100 and the second gate trench 200. The mesa 300 has a shape as has been discussed with reference to FIG. 1. FIG. 2A further shows gate contact areas 410 that are disposed in a peripheral area outside the cell array 400 which is defined by the first gate trench 100 and the second gate trench 200. Gate contacts 415 are disposed in the gate contact area 410. FIG. 2A further shows schematically gate conductive layer portions 510, 520 which are disposed outside the cell array 400. According to an embodiment, the first gate conductive layer portion 510 and the second gate conductive layer portion 520 may be connected to a common gate terminal 515.

As is further illustrated in FIG. 2A, a field plate contact area 420 may be disposed at an end portion of the first sections 110, 210. The end portions of the first sections 110 of the first gate trench are arranged remote from the second sections 120 of the first gate trench. Likewise, the end portions of the first sections 210 of the second gate trench are arranged remote from the second sections 220 of the second gate trench 200. The end portions of the first sections 110 of the first gate trench 100 are facing the second sections 220 of the second gate trench. The end portions of the first sections 210 of the second gate trench 200 are facing the second sections 120 of the first gate trench 100. As will be explained in more detail with reference to the following Figures, the field plate contacts 425 are formed at these end portions.

The mesa portions surrounding the end portions of the first sections 110, 210 are also referred to as "inactive mesa portions" 312. In more detail, as will be also explained with reference to the following Figures, source regions are not formed in these inactive mesa portions 312. Accordingly, no vertical transistor cell is formed in these inactive mesa portions 312. In particular, the inactive mesa portions are adjacent to the second sections 120, 220. Further, in a general transistor cell array comprising a plurality of vertical transistor cells which will be explained with reference of FIG. 2B, the outermost first regions 390 of the mesa 300 form inactive mesa portions 312. In more detail, no source regions are formed in the inactive mesa portions 312.

FIG. 2A schematically shows a boundary of a source implantation mask 440. In more detail, while performing a doping process, e.g. an ion implantation process for defining the source regions, only the inner portion of the mask 440 is uncovered, whereas the area outside the boundary of the mask 440 is covered. As a result, dopants are only introduced into the first regions 390 of the mesa 300 within the boundary of the mask 440.

FIG. 2A further shows a boundary of a gate dielectric mask 430. The portion within the boundary of the gate dielectric mask 430 is uncovered, whereas the region outside the boundary of the gate dielectric mask 430 is covered during an etching step. During this etching step, a field dielectric layer is removed from an upper portion of a sidewall of the first and second gate trenches 100, 200 at portions inside the boundary of the gate dielectric mask 430, whereas the field dielectric layer remains up to the first main surface of the semiconductor substrate in the area outside the boundary of the gate dielectric mask 430. In later processing steps, a gate dielectric layer will be formed in those portions of the first and second gate trenches 100, 200, from which the field dielectric layer has been removed.

FIG. 2A further shows a contour of a source conductive layer 530, e.g. a source metallization layer, which is connected to the source regions of the single transistor cells and the field plate contacts 425. The source conductive layer 530 may be arranged over the semiconductor substrate. This will be explained in more detail below.

Figure 2B:
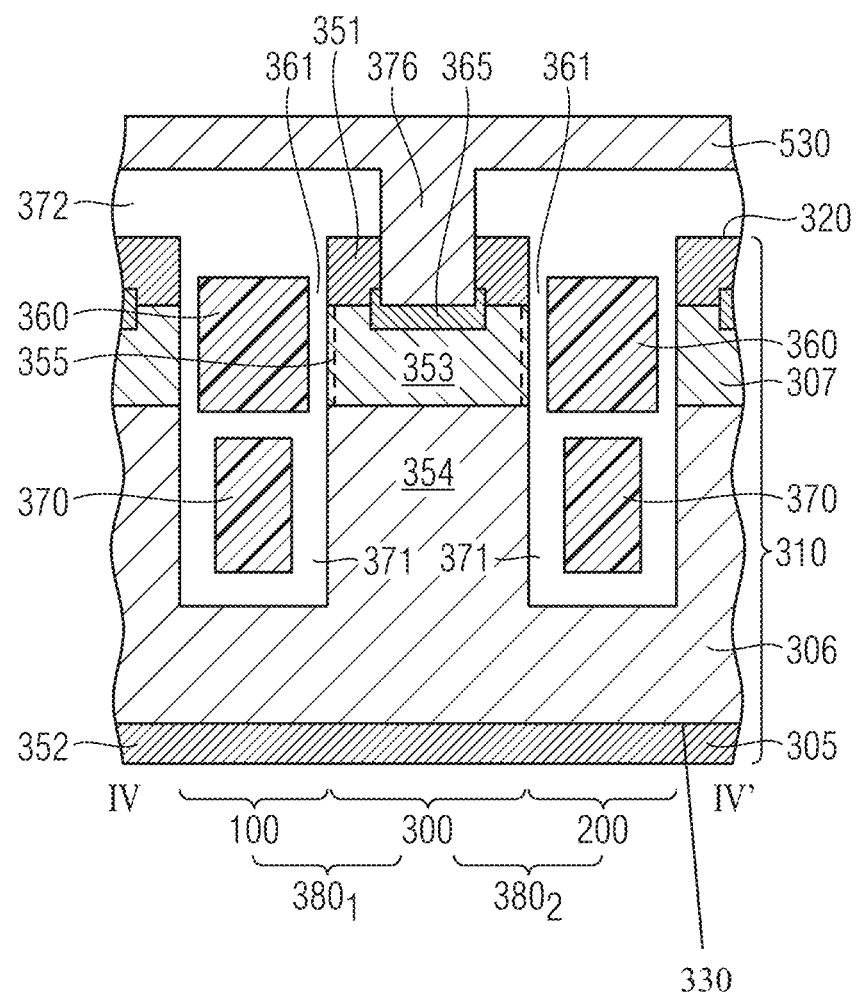
FIG. 2B shows a schematic cross-sectional view of a portion of the semiconductor device shown in FIG. 2A.

FIG. 2B shows a schematic cross-sectional view of two transistor cells $380_1$, $380_2$ between IV and IV', as is also indicated in FIG. 2A. The transistor cells $380_1$, $380_2$ are formed in a semiconductor substrate 310. For example, the semiconductor substrate 310 may comprise a base layer 305 of the first conductivity type. For example, the base layer 305 may be doped with n-type dopants at a high doping level to form a drain region 352 of the transistor. The semiconductor substrate 310 may further comprise an epitaxially or differently formed semiconductor layer 306 of the first conductivity type. A doped portion 307 of the second conductivity type may be disposed over the first layer 306. A first gate trench 100 and a second gate trench 200 are disposed in the first main surface 320 of the semiconductor substrate 310. A mesa 300 is defined between the first gate trench 100 and the second gate trench 200. A source region 351 is disposed adjacent to the first main surface 320 of the semiconductor substrate 310. For example, the source region may be of the first conductivity type. The doped portion 307 of the second conductivity type forms the body region 353 of the transistor cells $380_1$, $380_2$. The first layer 306 of the first conductivity type forms the drift zone 354 of the transistor cells $380_1$, $380_2$. The base layer 305 may form the drain region of the transistor. A gate electrode 360 may be disposed in the first and the second gate trench 100, 200 adjacent to the body region 353. The gate electrode 360 may be insulated from the body region 353 by means of a gate dielectric layer 361. A field plate 370 may be disposed in a lower portion of the first gate trench 100 and of the second gate trench 200. The field plate 370 may be insulated from the gate electrode 360. Further, the field plate 370 may be insulated from the adjacent semiconductor material 354 by means of the field dielectric layer 371. The source region 351 is electrically connected to the source conductive layer 530. Further, the body region 353 is connected to the source conductive layer 530 via a body contact portion 365. Due to the presence of this body contact portion 365, a bipolar parasitic transistor may be deteriorated or suppressed which could otherwise be formed in this portion. Generally, a power transistor comprises a plurality of single transistor cells $380_1$, . . . $380_n$ which are connected in parallel. For example, the single transistor cells $380_1$, . . . $380_n$ may comprise common components such as a common drain region.

When the transistor is switched on, e.g. by applying a corresponding voltage to the gate electrode 360, a conductive inversion layer (conductive channel) 355 is formed at the boundary between the body region 353 and the gate dielectric layer 361. Accordingly, the transistor is in a conductive state from the source region 351 to the drain region 352 via the drift zone 354. In case of switching-off, charges within the drift zone 354 are further depleted due to the presence of the field plate 370. Accordingly, a blocking of the current flow may be achieved. As has been explained above, due to the special structure of the first gate trench 100 and the second gate trench 200, the mesa is implemented as a path continuously extending along the cell array 400. As a result, the volume of the drift zone 354 adjacent to the field plate 370 does not substantially vary. As a consequence, overcompensation of the device may be avoided and the device characteristics may be improved.

Returning to the plan view of FIG. 2A, the semiconductor device 1000 comprises a plurality of vertical transistor cells $380_1$, . . . , $380_n$ in the manner as has been explained with reference to FIG. 2B. The source regions 351 of the vertical transistor cells are arranged at the first main surface 320, and the drain region 352 of the transistor is arranged at a second main surface 330 opposite the first main surface 320. The source regions 351 are arranged adjacent to the first sections 110, 210 of the first and second gate trenches 100, 200. The source regions 351 are absent from the second sections 120, 220. Accordingly, active mesa portions may be formed only at first sections 110, 210 of the first and second gate trenches 100, 200. Active mesa portions may be formed in the first regions 390 of the mesa.

Figure 2D:
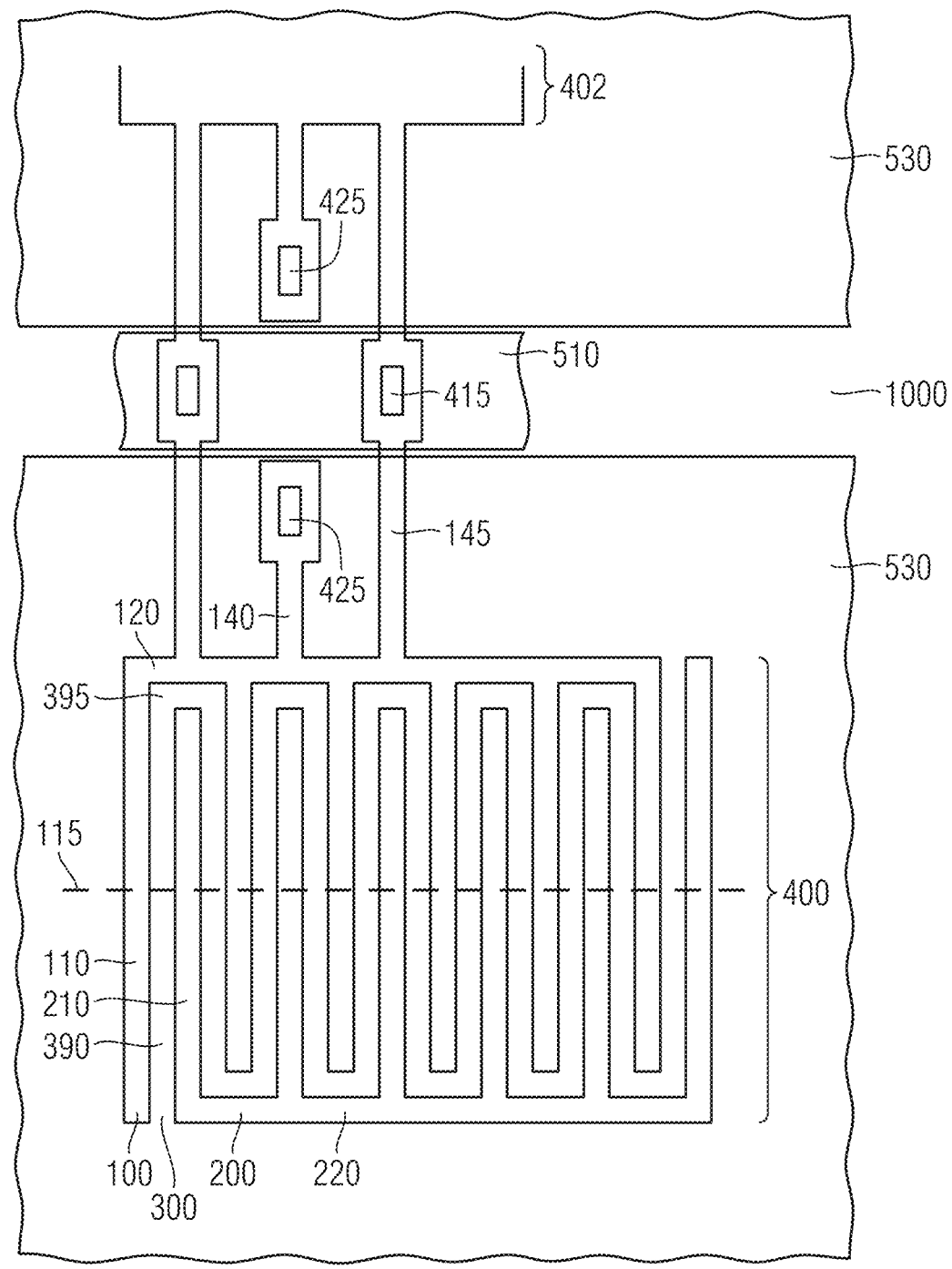
FIG. 2D shows a schematic horizontal cross-sectional view of a semiconductor device according to one or more embodiments.
Figure 2D:
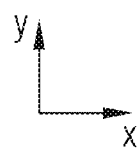

FIGS. 2C and 2D illustrate embodiments according to which field plate contacts 425 may be arranged outside the transistor cell array 400.

According to the embodiment of FIG. 2C, gate contact trenches 140 may extend outside the transistor cell array 400. The gate contact trenches 140 may be connected with the first gate trench 100 and the second gate trench 200. Gate contacts 415 may be arranged in the gate contact trenches 140. The gate contacts 415 may electrically connect the gate electrode 360 within the gate trench 100, 200 with a gate terminal, e.g. via a gate conductive layer 510. Further, a field plate contact 425 may be arranged in the gate contact trenches 140. The field plate contact 425 may electrically connect the field plate 370 within the gate trench 100, 200 with a source terminal, e.g. via a source conductive layer 530. The mesa 300 may have a constant width which does not vary. The gate contacts 415 and the field plate contacts 425 may have a width that is larger than a width of the mesa 300.

According to the embodiment of FIG. 2D, gate contact trenches 140 may extend outside the transistor cell array 400. The gate contact trenches 140 may be connected with the first gate trench 100 and the second gate trench 200. Gate contacts 415 may be arranged in the gate contact trenches 140. The gate contacts 415 may electrically connect the gate electrode 360 within the gate trench 100, 200 with a gate terminal, e.g. via a gate conductive layer 510. Further, a field plate contact 425 may be arranged in a field plate contact trench 145 that is connected with the first gate trench 100 and the second gate trench 200. The field plate contact trench 145 may be disconnected from the gate contact trench 140. The field plate contact 425 may electrically connect the field plate 370 within the gate trench 100, 200 with a source terminal, e.g. via a source conductive layer 530. The mesa 300 may have a constant width which does not vary. The gate contacts 415 and the field plate contacts 425 may have a width that is larger than a width of the mesa 300. FIG. 2D shows a further transistor cell array 402 that is shifted along the y-direction with respect to the transistor cell array 400. The further transistor cell array 402 and the transistor cell array 400 may share common field plate contacts 425.

Figure 3:
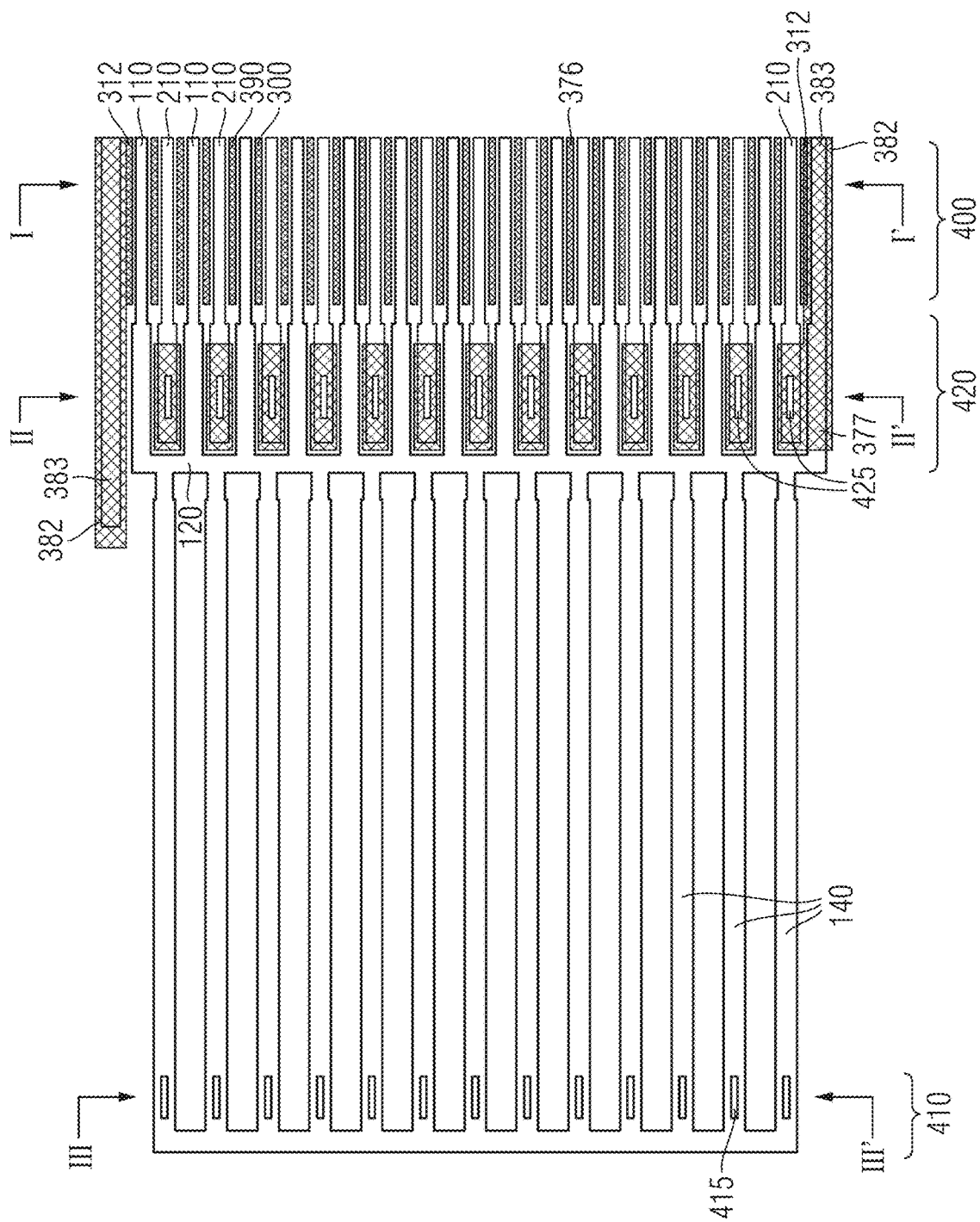
FIG. 3 shows a schematic horizontal cross-sectional view of a semiconductor device according to an embodiment.

FIG. 3 shows a horizontal cross-sectional view of a semiconductor device according to an embodiment. The horizontal cross-sectional view is taken in a region of the cell array 400, the field plate contact area 420 and the gate contact area 410. As is shown in FIG. 3, the cell array 400 comprises a plurality of alternating first sections 110 of the first gate trench 100 and first sections 210 of the second gate trench 200. The mesa comprises an inactive mesa portion 312 adjacent to the outermost first section 110 of the first gate trench 100. Further, an inactive mesa portion 312 is disposed adjacent to the outermost first section 210 of the second gate trench 200. The specific structure of the inactive mesa 312 will be explained below in more detail. Reference numeral 377 denotes a mask which is used for defining a gate electrode within the first gate trench 100 and the second gate trench 200. In more detail, when forming the transistor, first, a dielectric layer lining the sidewalls of the first and second gate trenches 100, 200 is formed, followed by forming a conductive filling. For forming the gate electrode, the conductive filling is removed from an upper portion of the first and second gate trenches 100, 200. No gate electrode is formed in a portion masked by the mask 377. These portions will form the inactive mesa portions 312.

Gate contact trenches 140 are arranged in contact with the first gate trench 100. The gate contacts 415 are formed in the gate contact trenches 140. As becomes apparent from FIG. 3, a pitch of the gate contact trenches 140 is larger than a pitch of the first sections 110, 210 of the first gate trench 100 or the second gate trench 200. As a result, gate contacts to the gate contact trenches may be formed more easily. First regions 390 of the mesa 300 are disposed between adjacent ones of the first sections 110 of the first gate trench 100 and the first sections 210 of the second gate trench 200. As can further be taken from FIG. 3, the end portions of the first sections may have a larger width than the remaining part of the first sections 110, 210, the width being measured perpendicularly with respect to the first direction. According to further embodiments, the width of the end portions of the first sections need not be larger than a width of the remaining part of the first sections 110, 210. Reference numeral 376 denotes source contacts which will be described in more detail below.

Figure 4A:
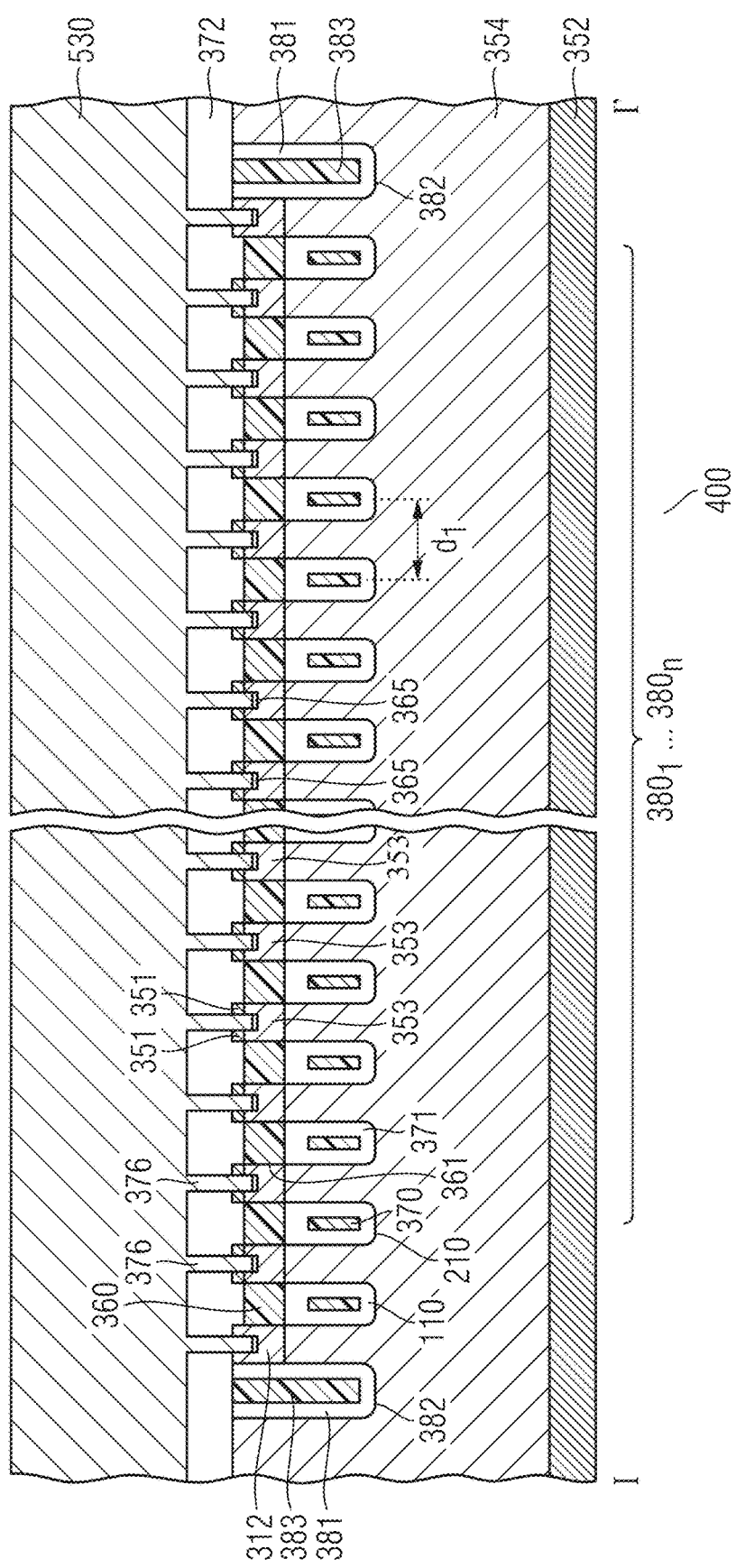
FIG. 4A shows a cross-sectional view of a portion of the semiconductor device shown in FIG. 3.

FIG. 4A shows a cross-sectional view of the semiconductor device shown in FIGS. 1 and 3. The cross-sectional view of FIG. 4A is taken in the cell array between I and I', as can also be taken from FIG. 3. The cross-sectional view intersects a plurality of transistor cells $380_1, \ldots 380_n$. The transistor cells may have a construction as has been explained above with reference to FIG. 2B. Accordingly, the transistor cell array comprises a plurality of first sections 110 of the first gate trench 100 and of first sections 210 of the second gate trench 200. The first sections 110 of the first gate trench 100 and the first sections 210 of the second gate trench 200 are alternatingly disposed. An inactive trench 382 is disposed at a boundary of the array of first sections 110, 210. The inactive trench 382 is filled with a conductive material 383. The conductive material is insulated from adjacent semiconductor material by means of the field dielectric layer 381. As has been explained with reference to FIG. 2A, due to the shape of the gate dielectric mask 430, the field dielectric layer 381 is not removed from the inactive trench 382. The semiconductor portion adjacent to the inactive trench 382 forms the inactive mesa portion 312 in which no source region is formed. A source conductive layer 530 is disposed over the transistor cell array 400. The source conductive layer 530 is electrically connected to the source regions 351 of the single transistor cells $380_1, \ldots, 380_n$ by means of source contacts 376. An insulating layer 372 is disposed between the semiconductor substrate and the source conductive layer 530. The first sections 110, 210 are disposed at a distance $d_1$.

FIG. 4B shows a cross-sectional view of the semiconductor device in the field plate contact area 420. The cross-sectional view of FIG. 4B is taken between II and II', as is also illustrated in FIG. 3. The semiconductor substrate 310 comprises the base layer 305 and the first layer 306 of the first conductivity type. A doped portion 307 is disposed adjacent to the first main surface 320 of the semiconductor substrate 310. No source regions 351 are disposed adjacent to the end portion of the first sections 110, 210 of the first and second gate trenches 100, 200, respectively. Accordingly, an inactive mesa portion 312 is disposed between the first sections 110 of the first gate trench and the first sections 210 of the second gate trench. In the field plate contact area 420, the first sections 210 of the second gate trench 200 are formed in such a manner that the field plate 370 is disposed adjacent to the first main surface 320 of the semiconductor substrate. Field plate contacts 425 are arranged so as to electrically connect the field plate 370 in the second gate trench 200 with the source conductive layer 530. Moreover, the conductive material 383 of the inactive trench 382 at the edge of the array is electrically connected to the source conductive layer 530.

Figure 4C:
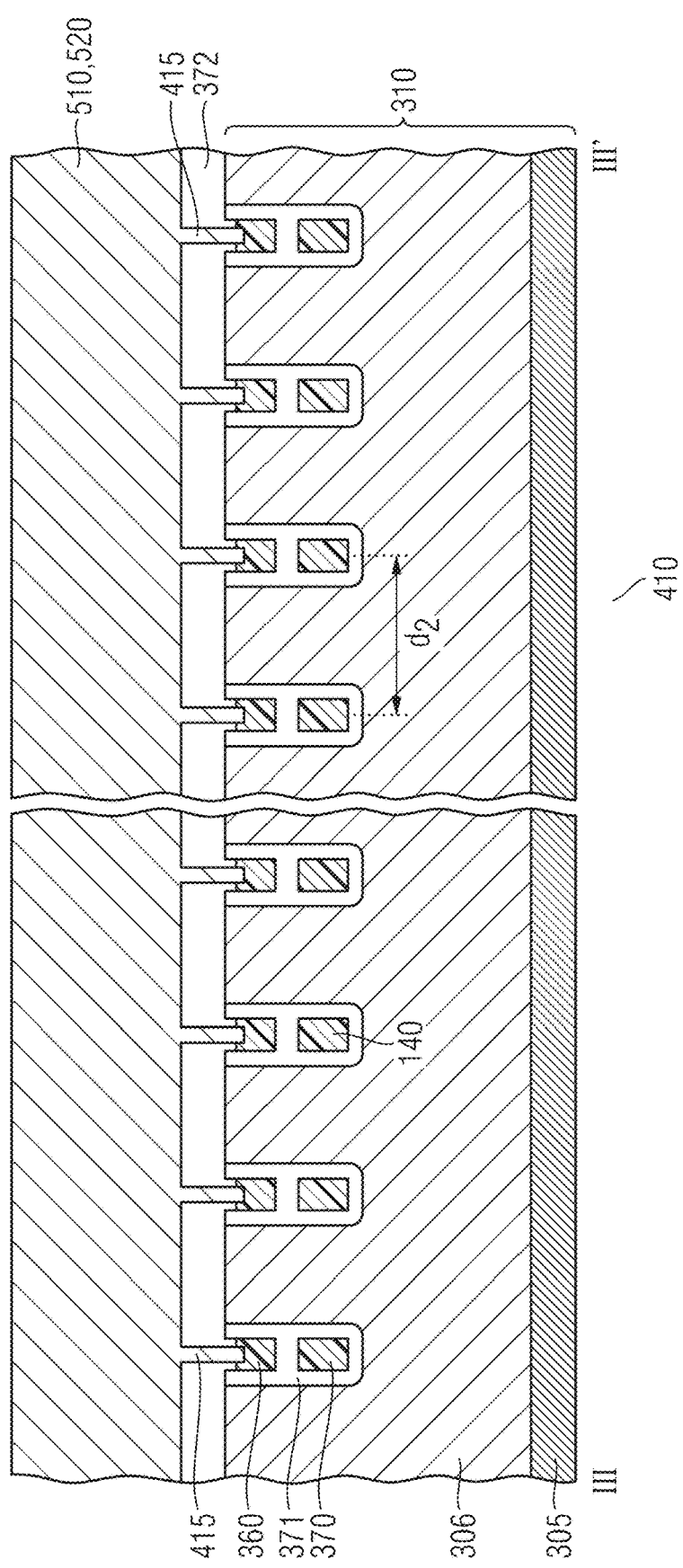
FIG. 4C shows a cross-sectional view of the gate contact area of the semiconductor device shown in FIG. 3.

FIG. 4C shows a cross-sectional view of the gate contact area 410. The cross-sectional view of FIG. 4C is taken between III and III', as is also illustrated in FIG. 3. FIG. 4C shows a plurality of gate contact trenches 140 that are disposed at a distance $d_2$. The distance $d_2$ may be larger than the distance $d_1$ between the first sections 110 of the first gate trench 100 and the first sections 210 of the second gate trench 200. The field plate 370 and the gate electrode 360 may be disposed in the gate contact trenches 140. The field plate 370 and the gate electrode 360 are insulated by means of a field dielectric layer 371 from the adjacent semiconductor material. The gate electrode 360 of each of the gate contact trenches 140 is electrically connected to the gate conductive layer 510, 520 by means of a gate contact 415. An insulating layer 372 is disposed between the semiconductor substrate 310 and the gate conductive layer 510, 520.

The semiconductor substrate may, e.g. comprise a base layer 305 of the first conductivity type and a first layer 306 of the first conductivity type.

Figure 5:
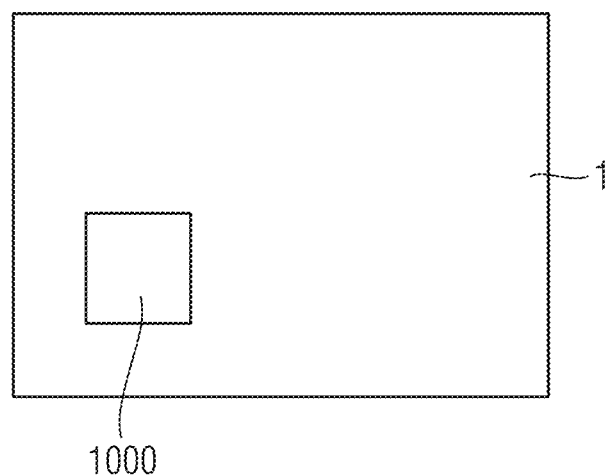
FIG. 5 schematically illustrates an electric device according to an embodiment.

FIG. 5 shows a schematic view of an electric device 1 according to an embodiment. The electric device comprises the semiconductor device 1000 which has been explained above. Among others, the electric device 1 may be a power MOSFET, a DC/DC converter or a power supply.

As has been explained above, due to the special layout of the semiconductor device comprising a first gate trench and a second gate trench and a mesa between the first gate trench and the second gate trench in the manner as has been discussed above, a termination region at the end of the first region of the mesa may be avoided since the mesa is implemented as a path so as to separate the first gate trench and the second gate trench. As a result, overcompensation in the termination region which might occur when the drift zone is depleted from three different directions may be avoided. At the same time, contacts to the gate electrode may be accomplished in an easy manner. In particular, the gate contacts may be disposed outside the transistor cell array 400. As a result, the contact area of the gate contacts may be increased without contacting an adjacent mesa. As a result, the feature sizes of the device, in particular, the pitch between the gate trenches may be further reduced without increasing problems of forming gate contacts. Further, due to the special structure of the end portion of the first sections, the field plate contacts may be widened so that contacts may be manufactured in a more simplified manner.

Figure 6A:
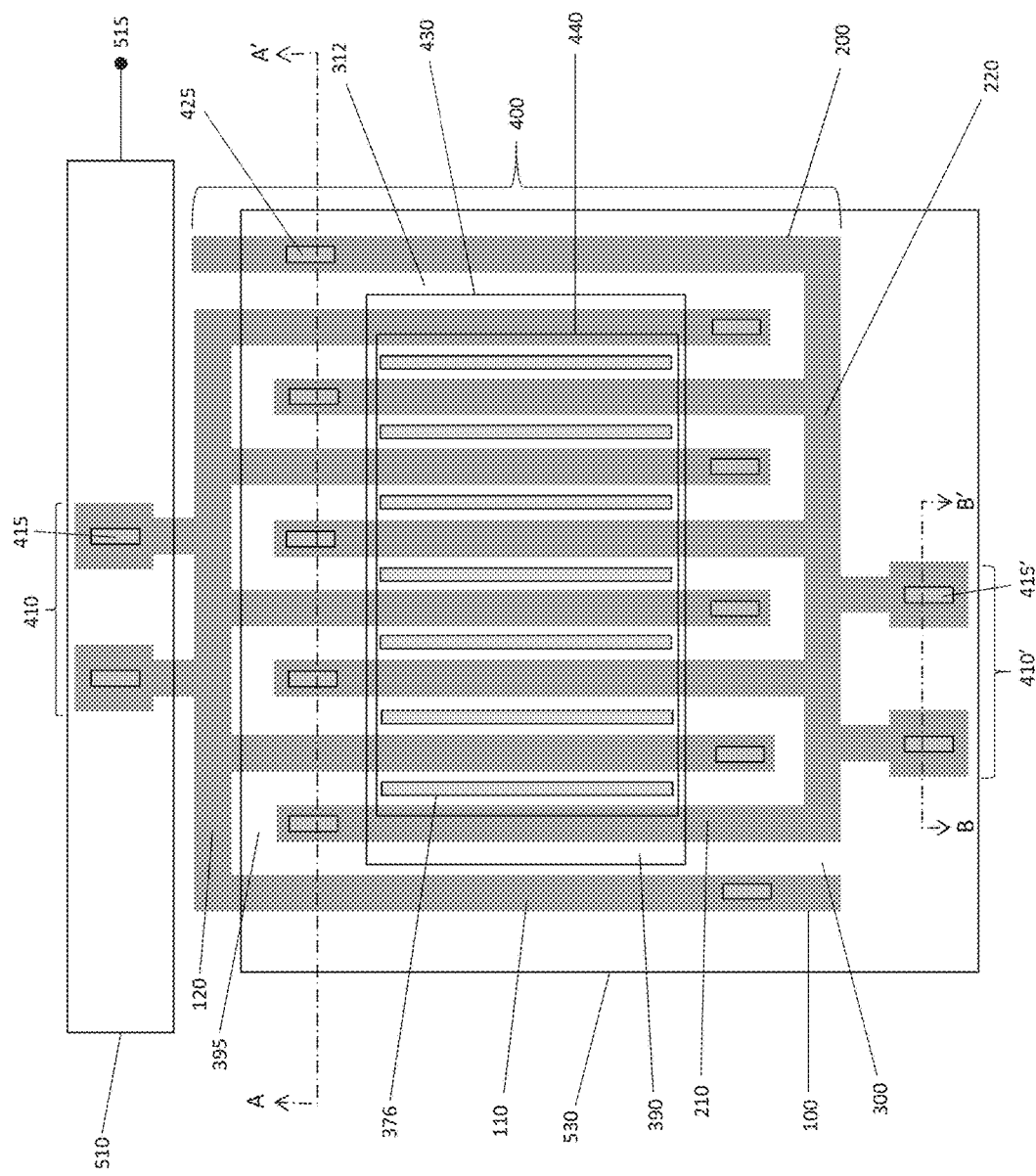
FIGS. 6A through 6C illustrate plan and cross-sectional views of another embodiment of a semiconductor device with a comb-like arrangement of gate trenches.
Figure 6B:
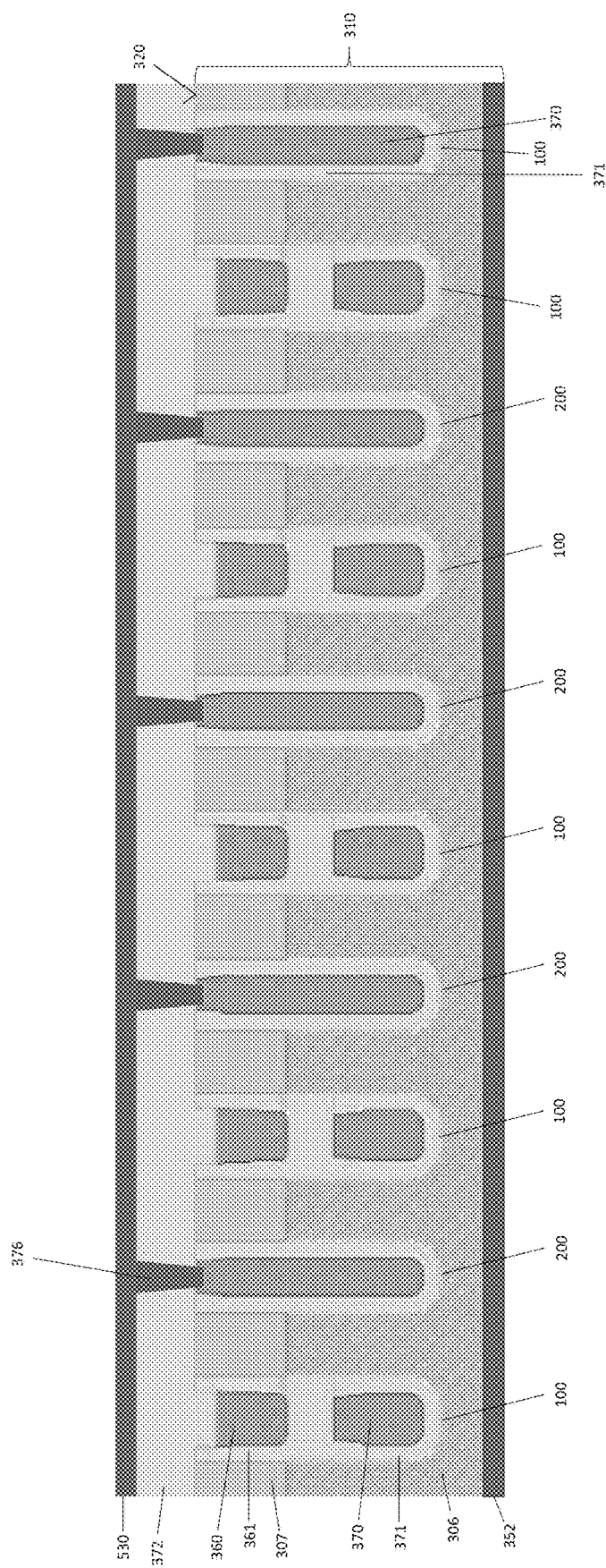
Figure 6C:
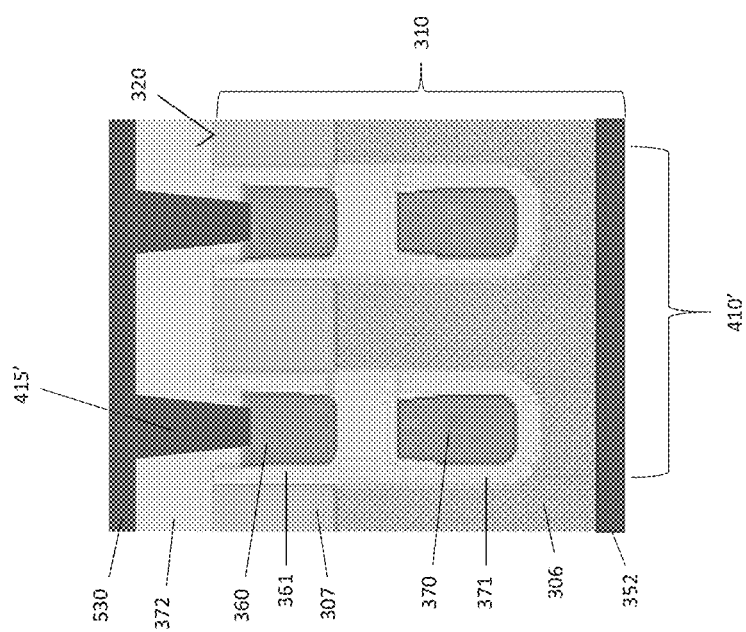

FIGS. 6A through 6C illustrate another embodiment of a semiconductor device with a comb-like arrangement of gate trenches. FIG. 6A shows a schematic plan view of the semiconductor device. FIG. 6B shows a schematic cross-sectional view of a portion of the semiconductor device between the line labelled A and A' in FIG. 6A. FIG. 6C shows a schematic cross-sectional view of a portion of the semiconductor device between the line labelled B and B' in FIG. 6A. Trenches labelled '100' and '200' are shown in more detail in FIGS. 6B and 6C, and in less detail in FIG. 6A due to the different types of views. Hence, structural details inside the trenches 100, 200 are visible in the cross-sectional views of FIGS. 6B and 6C but not in the plan view of FIG. 6A. For example, gate electrode, field plate and dielectric layer details are visible in FIGS. 6B and 6C but not in FIG. 6A.

Similar to the embodiment shown in FIGS. 2A and 2B, the portion within the boundary of gate dielectric mask 430 is uncovered whereas the region outside the boundary of the gate dielectric mask 430 is covered during an etching step. During this etching step, the field dielectric layer 371 is removed from an upper portion of a sidewall of the first and second gate trenches 100, 200 at portions inside the boundary of the gate dielectric mask 430, whereas the field dielectric layer 371 remains up to the first main surface 320 of the semiconductor substrate 310 in the area outside the boundary of the gate dielectric mask 430. In later processing steps, the gate dielectric layer 361 is formed in those portions of the first and second gate trenches 100, 200, from which the field dielectric layer 371 has been removed. While performing a doping process, e.g. an ion implantation process for defining the source regions 351, only the inner portion of mask 440 is uncovered whereas the area outside the boundary of the mask 440 is covered. As a result, dopants are only introduced into the first regions 390 of the mesa 300 within the boundary of the mask 440. Hence, the mesa 300 arranged between and separating the first gate trench 100 and the second gate trench 200 has active and inactive portions as previously explained herein.

Also similar to the embodiment shown in FIGS. 2A and 2B, source metal layer 530 is electrically connected to the source regions 351 of the single transistor cells $380_1, \ldots, 380_n$, by means of source contacts 376. The transistor cells $380_1, \ldots, 380_n$ and source regions 351 are out-of-view in FIGS. 6A through 6B, but are visible e.g. in FIG. 2B. An insulating layer 372 is disposed between the semiconductor substrate 310 and the source metal layer 530.

Further similar to the embodiment shown in FIGS. 2A and 2B, the gate electrode 360 within the first gate trench 100 is electrically connected by first gate contacts 415 to a gate terminal in a first gate contact area 410, e.g. via gate conductive layer 510. The first gate contact area 410 may be disposed in a peripheral area outside the cell array 400 and the first gate contacts 415 may be disposed in the first gate contact area 410, as previously described herein.

Different than the embodiment shown in FIGS. 2A and 2B, the gate electrode 360 within the second gate trench 200 is electrically connected by second gate contacts 415' to the source metal layer 530 in a second gate contact area 410' as shown in FIG. 6C. Gate conductive layer portion 520 shown in FIG. 2A is omitted according to the embodiment shown in FIGS. 6A through 6C, and the source metal layer 530 instead extends over the second gate contact area 410'. The second gate contacts 415' extend vertically from the gate electrode 360 within the second gate trench 200 to the overlying source metal layer 530, electrically connecting the gate electrode 360 within the second gate trench 200 to source potential. The second gate contact area 410' may be disposed in the peripheral area outside the cell array 400 and the second gate contacts 415' may be disposed in the second gate contact area 410'.

According to the embodiment illustrated in FIGS. 6A through 6C, at least some of the first sections 210 of the second trench 200 are electrically connected to the source metal layer 530 instead of a gate potential. As depicted, all of the first sections 210 of the second trench 200 are electrically connected to the source metal layer 530 and thus 50% of all trench sections are inactive. Fewer trench sections 210 of the second trench 200 may be inactivated by connecting less of the trench sections 210 to the source metal layer 530.

Alternatively, at least some of the first sections 110 of the first trench 100 may be electrically connected to the source metal layer 530 instead of a gate potential. For example, gate conductive layer portion 510 shown in FIG. 2A may be omitted and the source metal layer 530 may instead extend over the first gate contact area 410. The first gate contacts 415 may extend vertically from the gate electrode 360 within the second gate trench 200 to the overlying source metal layer 530, electrically connecting the gate electrode 360 within the second gate trench 200 to source potential instead of gate potential. In each case, inactivating some of the trench sections by electrical connection to the source potential instead of a gate potential reduces the gate charge of the semiconductor device which in turn allows for optimizing FOM (figure of merit).

Figure 7:
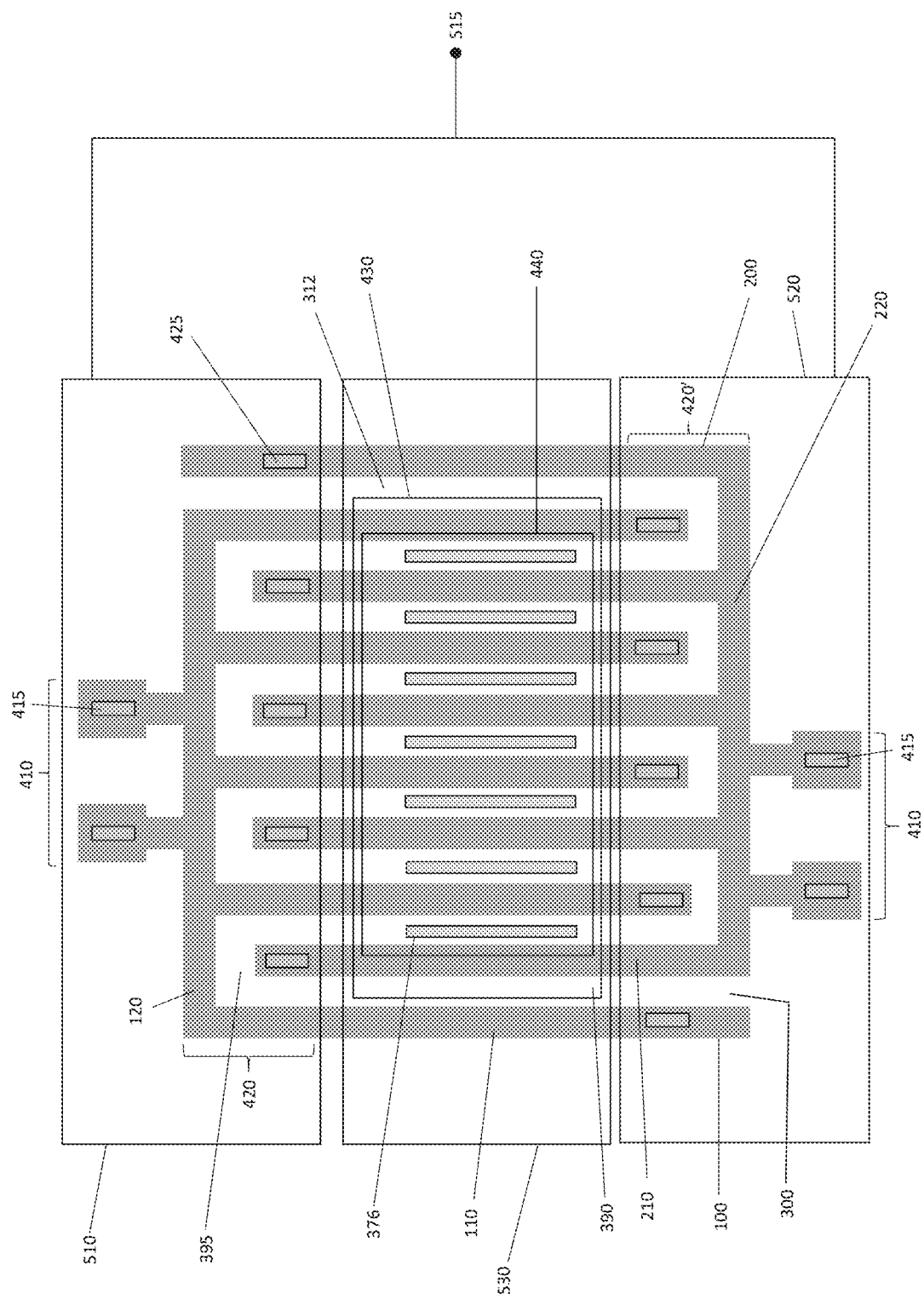
FIG. 7 illustrates a schematic plan view of another embodiment of a semiconductor device with a comb-like arrangement of gate trenches.

FIG. 7 illustrates another embodiment of a semiconductor device with a comb-like arrangement of gate trenches. The embodiment shown in FIG. 7 is similar to the embodiment shown in FIGS. 2A and 2B. Different, however, the field plate 370 in the first trench 100 is electrically connected to the first gate metal layer 510 and the field plate 370 in the second trench 200 is electrically connected to the second gate metal layer 520. This way, the field plates 370 in the first and second trenches 100, 200 are tied to gate potential instead of source potential.

When the gate electrodes 360 in the first and second trenches 100, 200 are grounded, the field plates 370 in the first and second trenches 100, 200 are also grounded but still provide voltage blocking. Since the field plates 370 in the first and second trenches 100, 200 have the same potential as the gate electrodes 360 in the on-state, the field plates 370 act like an additional gate which lowers RDSon (on-state resistance). The gate electrodes 360 in the first and second trenches 100, 200 still provide a standard depletion function. All gate fingers are shown as active in FIG. 7, but some fingers may be inactivated e.g. as previously described herein in connection with FIGS. 6A through 6C.

In one embodiment, the first gate metal layer 510 extends over the first field plate contact area 420 disposed at the end portion of the first sections 110 of the first trench 100. The field plate contacts 425 in the first field plate contact area 420 extend vertically between the field plate 370 in the first trench 100 and the first gate metal layer 510 disposed over the first field plate contact area 420 to electrically connect the field plate 370 in the first trench 100 to the first gate potential. The second gate metal layer 520 similarly extends over the second field plate contact area 420' disposed at the end portion of the first sections 210 of the second trench 200. The field plate contacts 425 in the second field plate contact area 420' extend vertically between the field plate 370 in the second trench 200 and the second gate metal layer 520 disposed over the second field plate contact area 420' to electrically connect the field plate 370 in the second trench 200 to the second gate potential. The first and second gate potentials are shown as being the same via common gate terminal 515, but may instead be independently-controlled potentials.

The field plate 370 in one of the trenches 100, 200 may instead be electrically connected to source potential by extending the source metal layer 530 over the corresponding field plate contact area 420/420' so that the field plate contacts 425 in that field plate contact area 420/420' extends to the source metal layer 530 instead of a gate metal layer.

Figure 8:
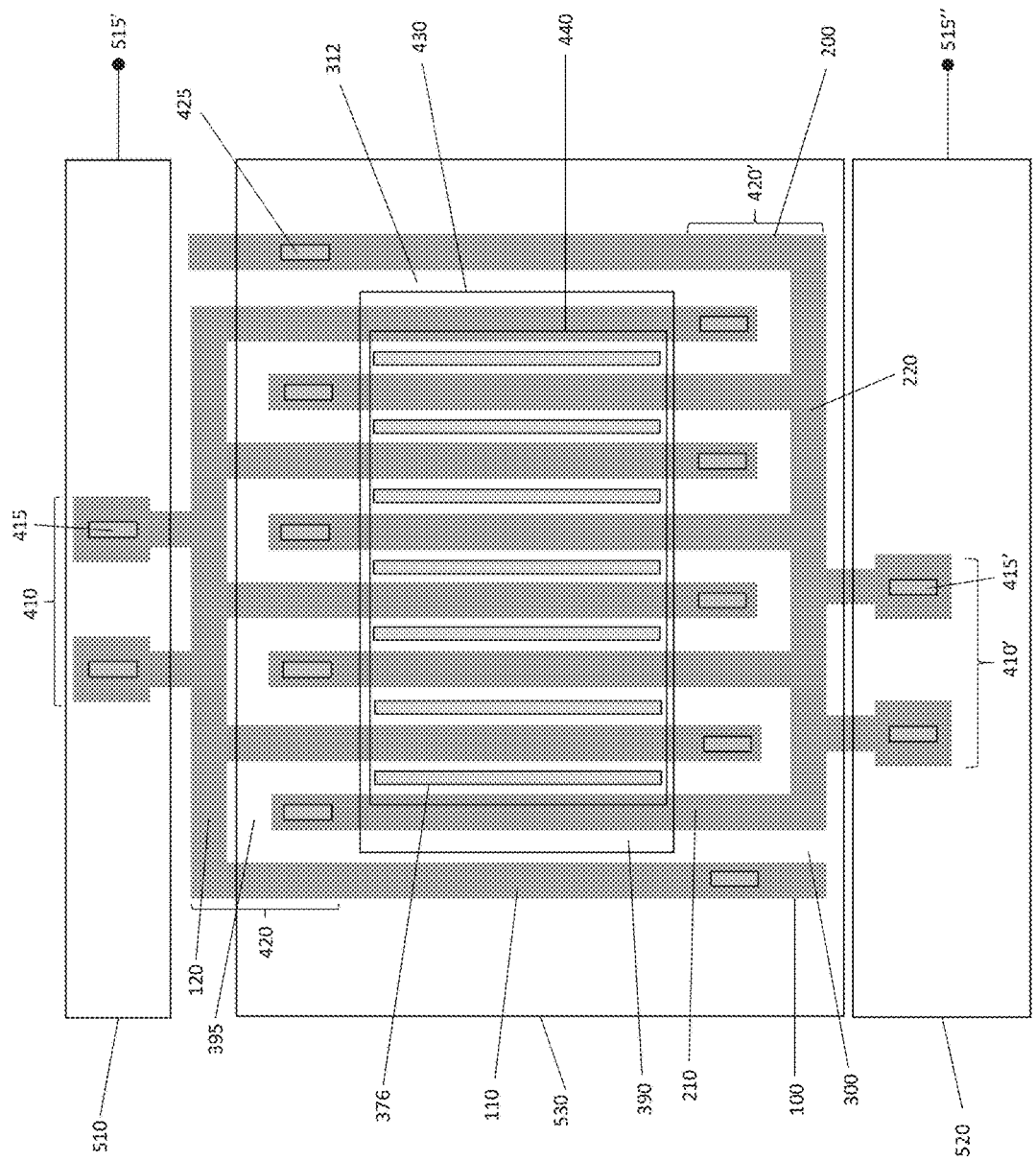
FIG. 8 illustrates a schematic plan view of another embodiment of a semiconductor device with a comb-like arrangement of gate trenches.

FIG. 8 illustrates another embodiment of a semiconductor device with a comb-like arrangement of gate trenches. The embodiment shown in FIG. 8 is similar to the embodiment shown in FIGS. 2A and 2B. Particularly, the first gate metal layer 510 is disposed over and electrically connected to the first gate contact area 410. The second gate metal layer 520 is disposed over and electrically connected to the second gate contact area 410'. The field plate 370 in the first sections 110 of the first trench 100 and the field plate 370 in the first sections 210 of the second trench 200 are electrically connected to the source metal layer 530.

Different, however, the first gate metal layer 510 is configured to provide a first gate potential to the gate electrode 360 in the first trench 100 via a first gate terminal 515' and the second gate metal layer 520 is configured to provide a second gate potential to the gate electrode 360 in the second trench 200 via a second gate terminal 515" separate from the first gate terminal 515', the first gate potential being independent of the second gate potential. This way, the gate electrode 360 in the first trench 100 may be driven independently and/or at a different level than the gate electrode 360 in the second trench 200. The individual gate control may be used to activate different parts of the same chip (die).

Figure 9:
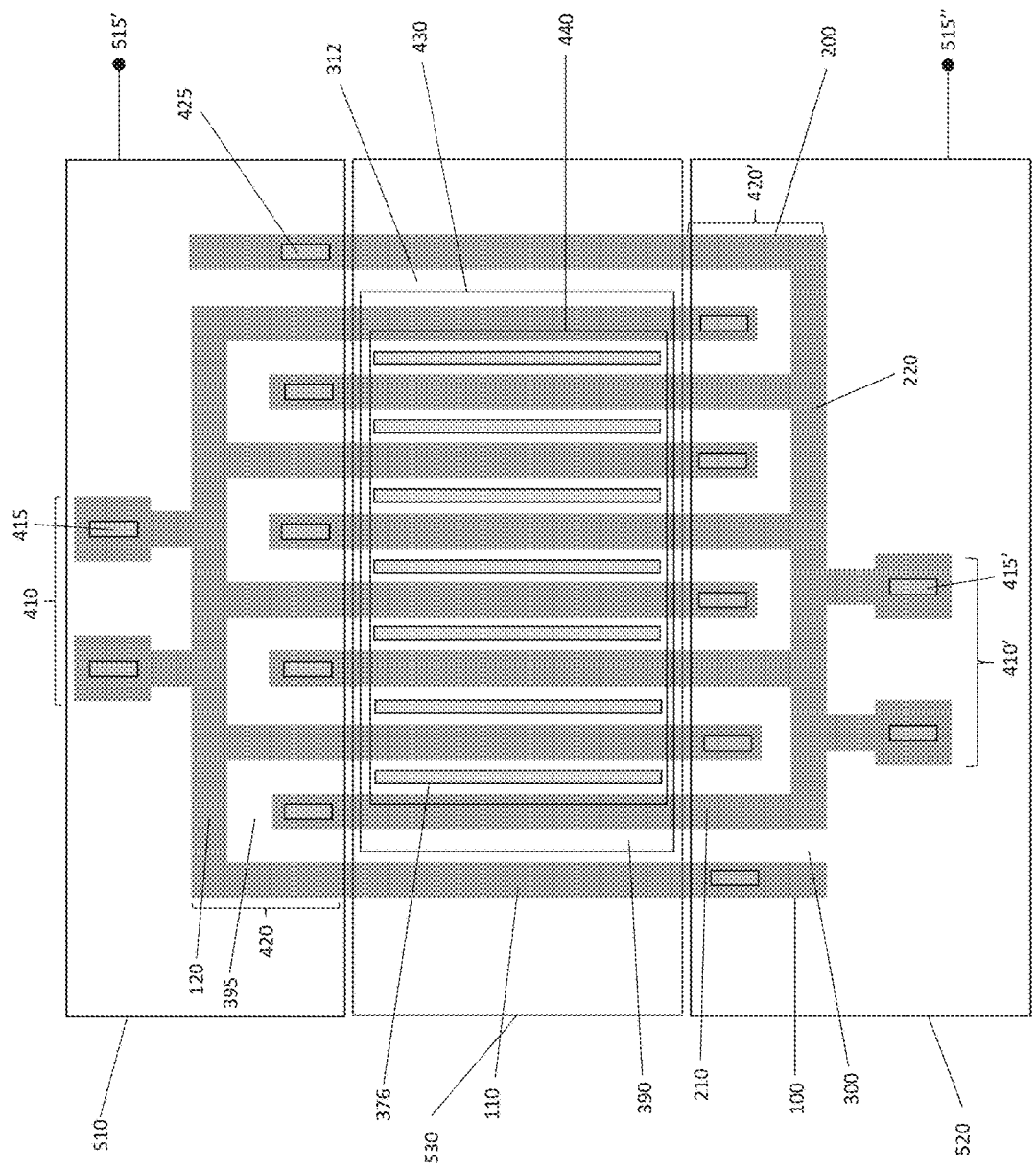
FIG. 9 illustrates a schematic plan view of another embodiment of a semiconductor device with a comb-like arrangement of gate trenches.

FIG. 9 illustrates another embodiment of a semiconductor device with a comb-like arrangement of gate trenches. The embodiment shown in FIG. 9 is similar to the embodiment shown in FIG. 8. Different, however, the first gate metal layer 510 extends over the first field plate contact area 420 disposed at the end portion of the first sections 110 of the first trench 100 and the second gate metal layer 520 extends over the second field plate contact area 420' disposed at the end portion of the first sections 210 of the second trench 200, e.g., as shown in FIG. 7. This way, the field plate contacts 425 in the first field plate contact area 420 may extend vertically between the field plate 370 in the first trench 100 and the first gate metal layer 510 disposed over the first field plate contact area 420 to electrically connect the field plate 370 in the first trench 100 to the first gate potential. The field plate contacts 425 in the second field plate contact area 420' similarly extend vertically between the field plate 370 in the second trench 200 and the second gate metal layer 520 disposed over the second field plate contact area 420' to electrically connect the field plate 370 in the second trench 200 to the second gate potential. As explained above in connection with FIG. 7, the field plate 370 in one of the trenches 100, 200 may instead be electrically connected to source potential by extending the source metal layer 530 over the corresponding field plate contact area 420/420' so that the field plate contacts 425 in that field plate contact area 420/420' extends to the source metal layer 530 instead of a gate metal layer.

Figure 10A:
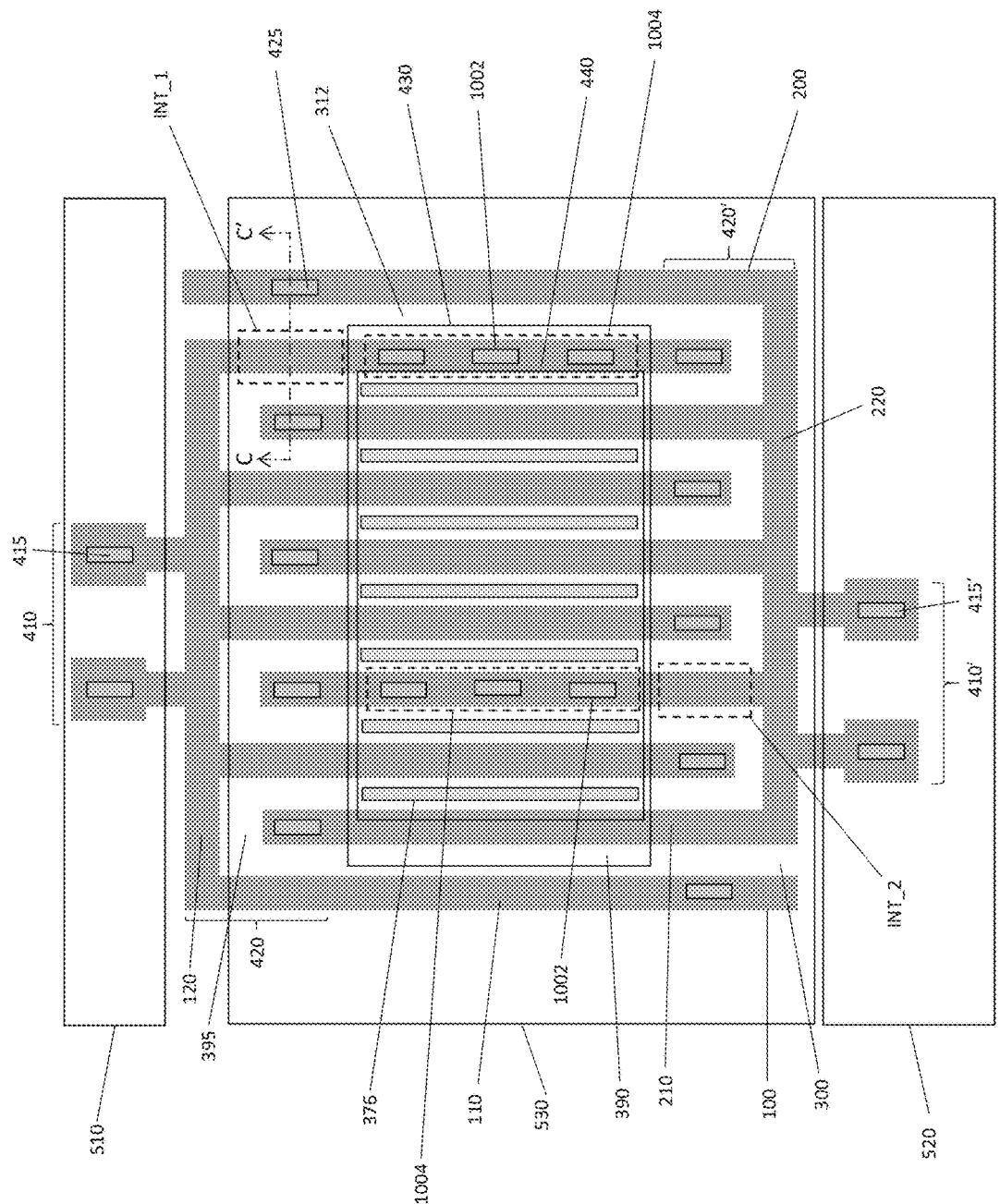
FIGS. 10A and 10B illustrate plan and cross-sectional views of another embodiment of a semiconductor device with a comb-like arrangement of gate trenches.
Figure 10B:
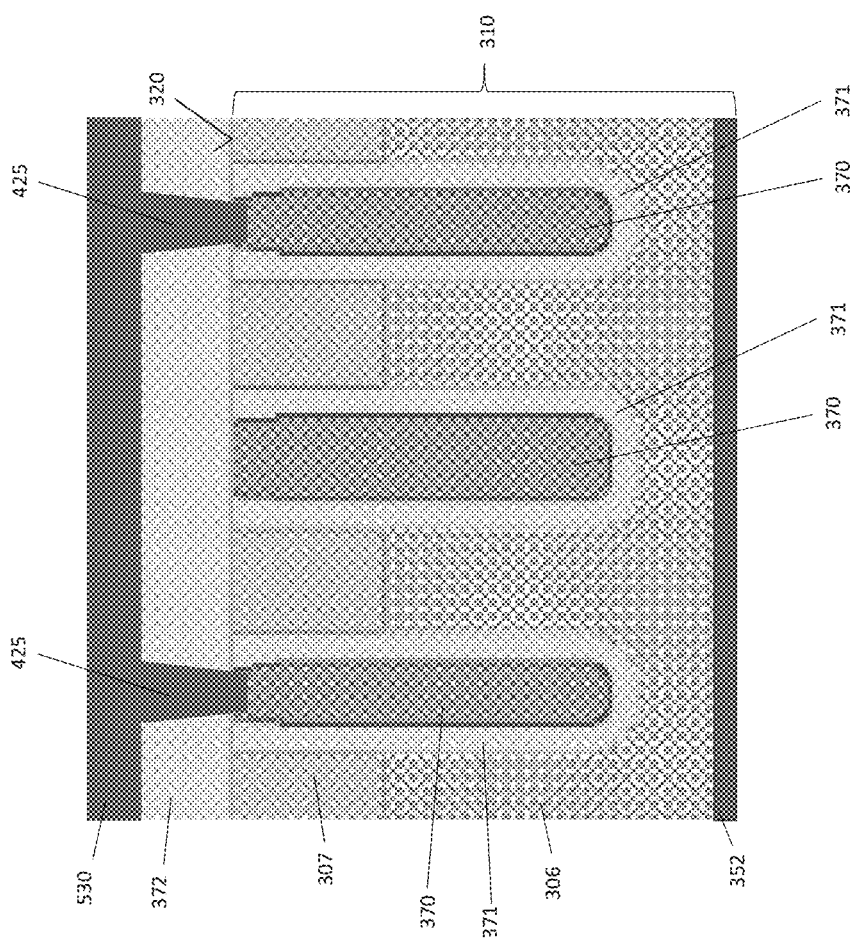

FIGS. 10A and 10B illustrate another embodiment of a semiconductor device with a comb-like arrangement of gate trenches. FIG. 10A shows a schematic plan view of the semiconductor device. FIG. 10B shows a schematic cross-sectional view of a portion of the semiconductor device between the line labelled C and C' in FIG. 10A.

Similar to the embodiment shown in FIGS. 2A and 2B, the gate electrode 360 within the first trench 100 is electrically connected by first gate contacts 415 to a first gate metal layer 510 and the gate electrode 360 within the second trench 100 is electrically connected by second gate contacts 415' to a gate metal layer 520. The first and second gate metal layers 510, 520 may be connected to a common gate terminal, e.g. as shown in FIG. 7, or independent gate terminals, e.g. as shown in FIGS. 8 and 9. Different, however, the gate electrode 360 in the first trench 100 and/or in the second trench 200 is interrupted and electrically connected to the source metal layer 530 to form a MOS gated-diode.

FIG. 10A shows the gate electrode 360 in the first trench 100 interrupted in the region labeled INT_1, and the gate electrode 360 in the second trench 200 interrupted in the region labeled INT_2. Each gate electrode 360 may be interrupted in more than one first section 110/210 of each trench 100/200. The gate electrodes 360 may be interrupted in one or more first sections 110/210 of both trenches 100, 200 as shown in FIGS. 10A and 10B, or only one of the gate electrodes 360 may be interrupted in one or more first sections 110/210 of either the first trench 100 or the second trench 200 but not both trenches 100, 200.

FIG. 10B shows the first section 110 of the first trench in which the gate electrode 360 is interrupted. According to this embodiment, the gate electrode 360 in the first trench 100 is interrupted in at least one of the first sections 110 of the first trench 100 before reaching the second section 120 of the first trench 100 and is separated from the second section 120 of the first trench 100 by the field dielectric layer 371. The field plate 370 and the field dielectric layer 371 occupy the first trench in the interrupted region labeled INT_1 as shown in FIG. 10B. For example, recess of the field plate 370 in the region labelled INT_1 may be blocked during gate electrode formation to interrupt the gate electrode 360 in region INT_1. The gate electrode 360 in the second trench 200 can be interrupted in a similar manner in the region labeled INT_2 in FIG. 10A, wherein the field plate 370 and the field dielectric layer 371 occupy the second trench 200 in this region.

The part of each gate electrode 360 that is interrupted in at least one of the first sections 110, 120 of the first and/or second trenches 100, 200 is electrically connected to the source metal layer 530 by one or more contacts 1002 to form a respective MOS gated-diode 1004. A MOS gated-diode is a two-terminal device in which charge is stored when a voltage above the threshold voltage is applied between gate and source, and negligible charge is stored otherwise.

Figure 11A:
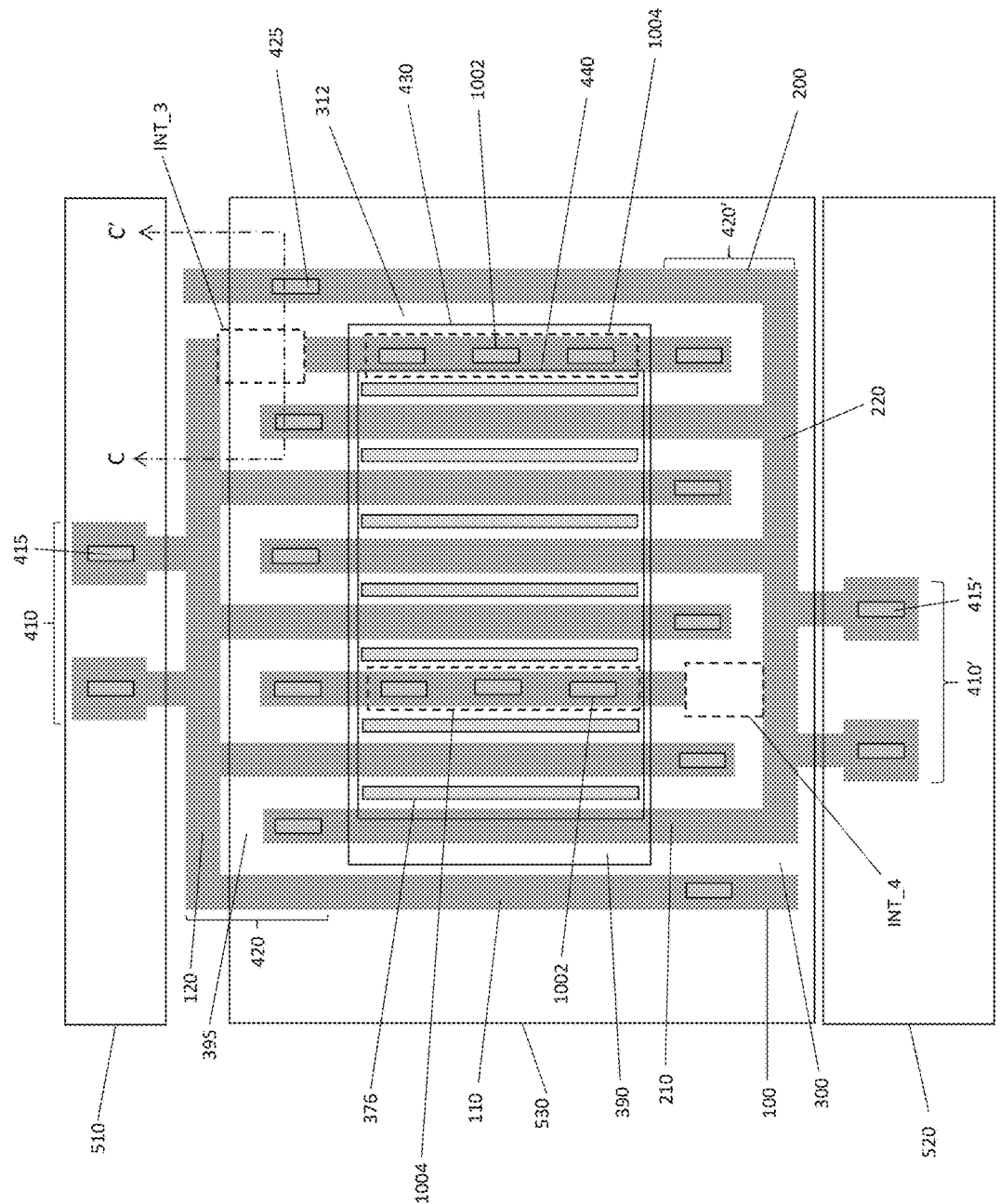
FIGS. 11A and 11B illustrate plan and cross-sectional views of another embodiment of a semiconductor device with a comb-like arrangement of gate trenches.
Figure 11B:
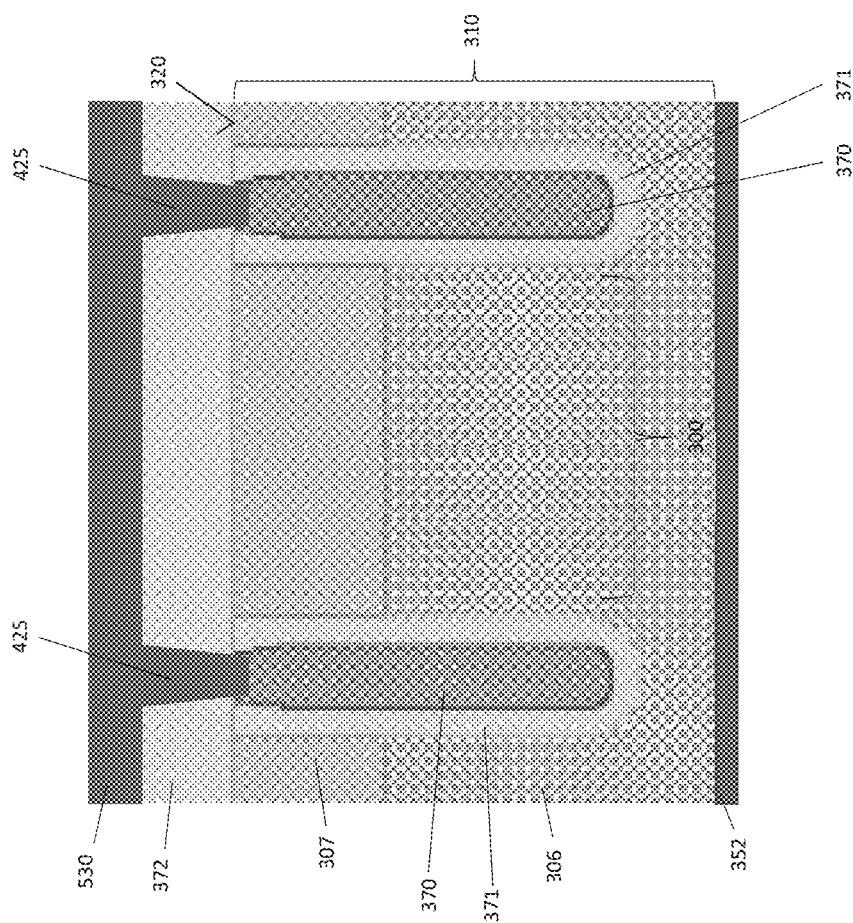

FIGS. 11A and 11B illustrate another embodiment of a semiconductor device with a comb-like arrangement of gate trenches. FIG. 11A shows a schematic plan view of the semiconductor device. FIG. 11B shows a schematic cross-sectional view of a portion of the semiconductor device between the line labelled C and C' in FIG. 11A.

The embodiment shown in FIGS. 11A and 11B is similar to the embodiment shown in FIGS. 10A and 10B in that the gate electrode 360 in the first trench 100 and/or in the second trench 200 is interrupted and electrically connected to the source metal layer 530 to form a MOS gated-diode. Different, however, at least one of the first sections 110/120 of the first and or second trench 100/200 terminates before reaching the second section 120/220 of the trench 100/200 and is separated from the second section 120/220 of the trench 100/200 by the semiconductor mesa 300. As a result, the gate electrode 360 in at least one of the first sections 110/120 of the first and/or second trench 100/200 that terminates before reaching the second section 120/220 of the trench 100/200 is electrically connected to the source metal layer 530 by one or more contacts 1002 to form a respective MOS gated-diode 1004. The gate electrode 360 may be interrupted in this way in the first trench 100, in the second trench 200 or in both trenches 100, 200. That is, one or more 'teeth' of the comb-like gate structure is severed from the main body of the comb. The regions in which the gate electrode 360 are interrupted are labeled INT_3 and INT_4 in FIG. 11A.

Figure 12:
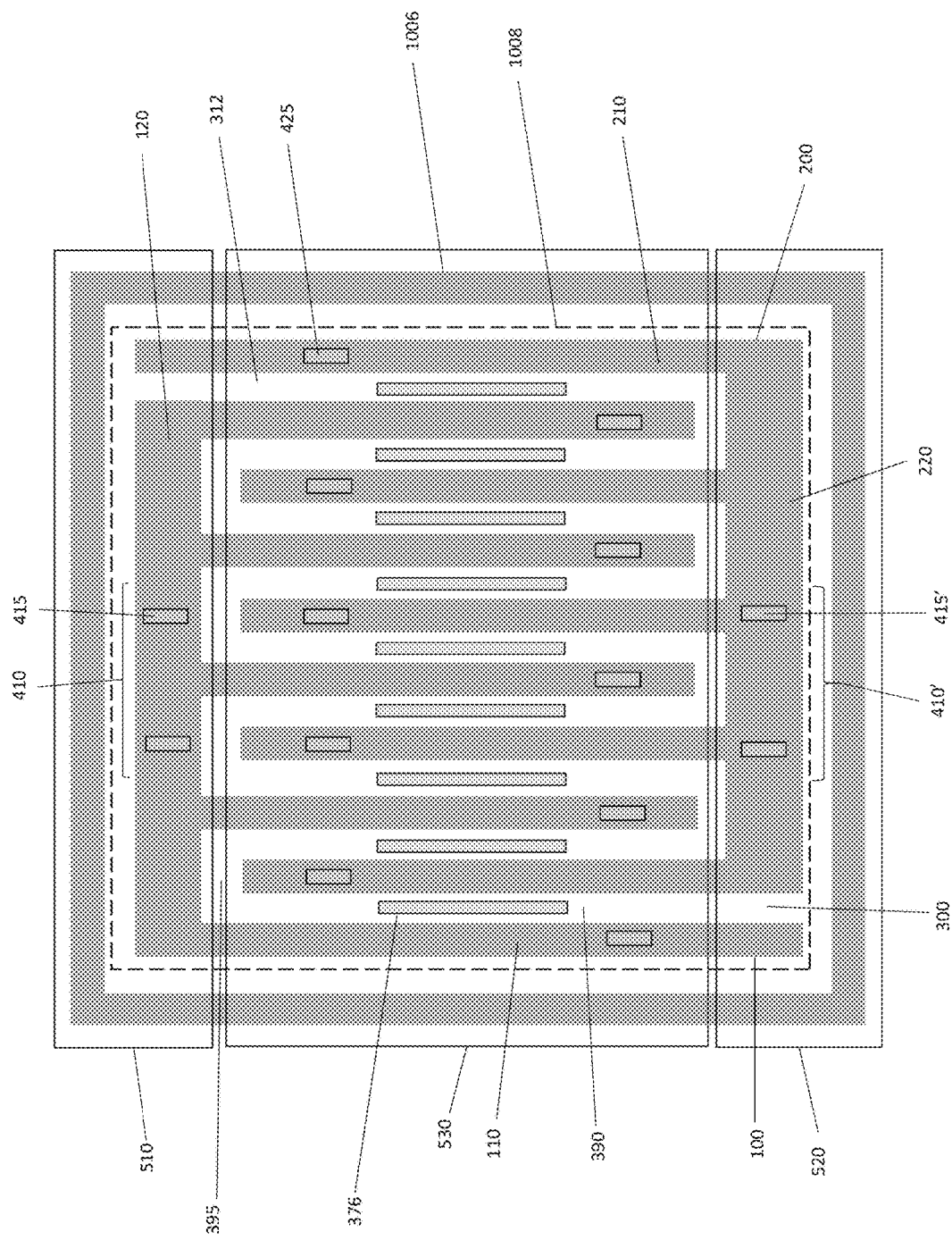
FIG. 12 illustrates a schematic plan view of another embodiment of a semiconductor device with a comb-like arrangement of gate trenches.

FIG. 12 illustrates another embodiment of a semiconductor device with a comb-like arrangement of gate trenches. The embodiment shown in FIG. 12 is similar to the embodiment shown in FIGS. 2A and 2B. Particularly, a plurality of vertical transistor cells $380_1, \ldots, 380_n$ arranged adjacent to the first sections 110 of the first trench 100 and the first sections 210 of the second trench 200 each comprise a source region 351 arranged at the first main surface 320 of the semiconductor substrate 310 and a drain region 352 arranged at a second main surface of the substrate opposite 310 the first main surface 320. The vertical transistor cells $380_1, \ldots, 380_n$, source regions 351 and drain region 352 are out-of-view in FIG. 12, but are visible e.g. in FIG. 2B. Different, however, a third trench 1006 surrounds the first trench 100 and the second trench 200 in the first main surface 320 of the semiconductor substrate 310, isolating the source regions 351 of the plurality of vertical transistor cells $380_1, \ldots, 380_n$ of the main device 1008 from source regions of an adjacent device (not shown).

Figure 13:
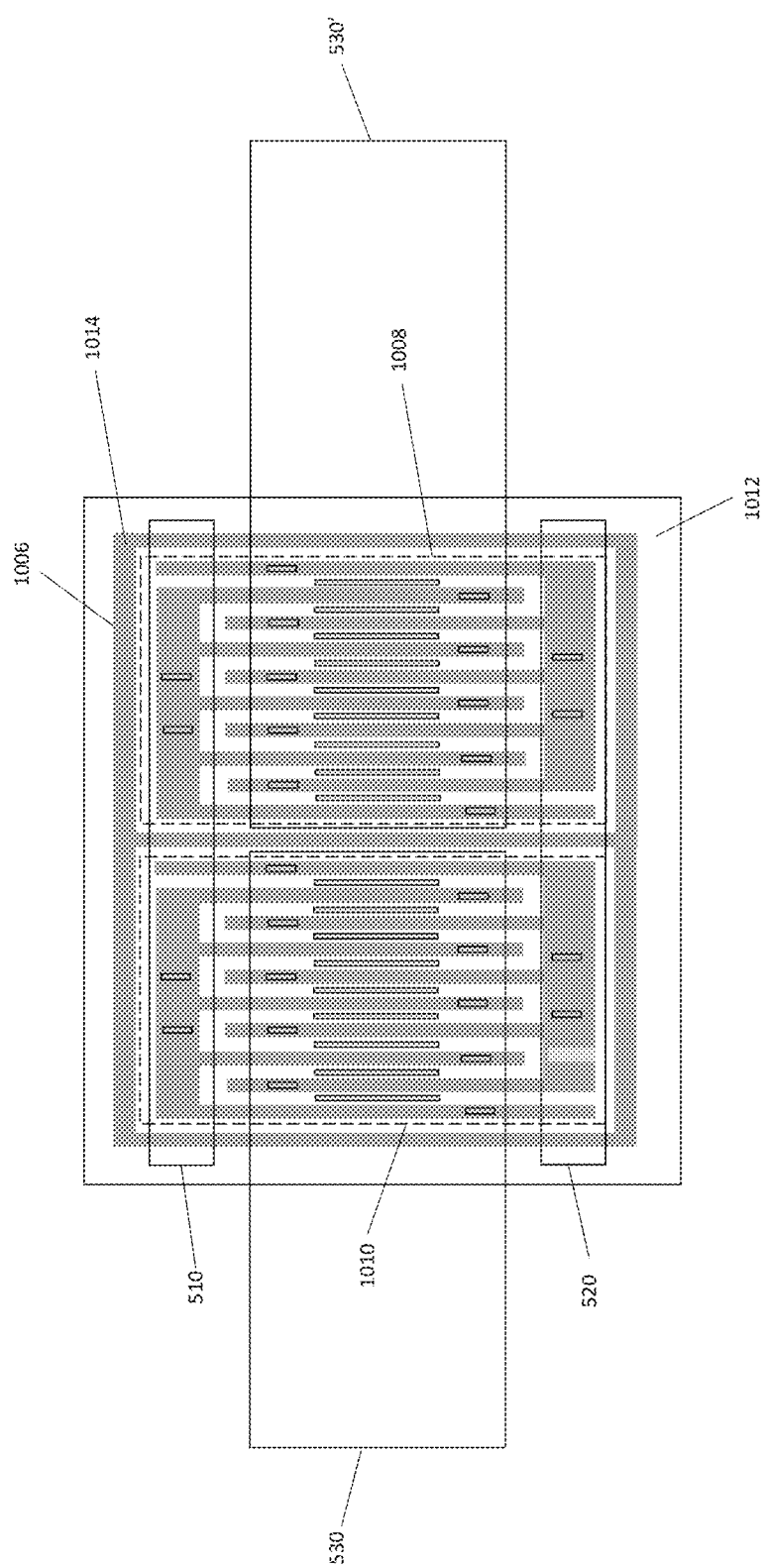
FIG. 13 illustrates a schematic plan view of another embodiment of a semiconductor device with a comb-like arrangement of gate trenches.

FIG. 13 illustrates the semiconductor device 1008 shown in FIG. 12 adjacent another semiconductor device 1010 in the same semiconductor substrate 310. Both semiconductor devices 1008, 1010 have a comb-like arrangement of gate trenches. The plurality of vertical transistor cells $380_1, \ldots, 380_n$ of the main device 1008 and the adjacent device 1010 are electrically connected to the same gate potential via first and second gate metal layers 510, 520 and to the same drain potential. The vertical transistor cells $380_1, \ldots, 380_n$, source regions 351 and drain region 352 are out-of-view in FIG. 13, but are visible e.g. in FIG. 2B.

Separate source metal layers 530, 530' may be provided for the adjacent devices 1008, 1010 so that the devices 1008, 1010 have independent source potentials, the source regions of the adjacent devices being electrically isolated from one another by the third trench 1006. For example, the main device 1008 may be a power transistor device and the adjacent device 1010 may be a sense transistor configured to mirror the current in the main device 1008. The current in the adjacent device 1010 is a fraction of the current in the main device 1008, wherein the fraction depends on the size difference between the two devices 1008, 1010.

In FIGS. 12 and 13, the third trench 1006 surrounding the first and second trenches 100, 200 isolates the source potentials of the adjacent devices 1008, 1010. The semiconductor mesa 1012 surrounding the third trench 1006 provides a potential island inside the third trench 1006. An electrode 1014 in the third trench 1006 may be coupled e.g. to the source potential of the main device 1008, or to another potential. The trench configuration shown in FIGS. 12 and 13 may be replicated to realize multiple potential islands electrically isolated from one another.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device, comprising:
   a first trench and a second trench in a first main surface of a semiconductor substrate, each of the first and second trenches comprising first sections extending lengthwise in a first direction and a second section extending lengthwise in a second direction transverse to the first direction, the second section of the first trench being disposed opposite to the second section of the second trench;
   a semiconductor mesa separating the first and second trenches;
   a source metal layer above the first main surface of the semiconductor substrate and electrically connected to source regions in the semiconductor mesa;
   a first gate contact area disposed in a peripheral area outside a cell array defined by the first trench and the second trench, the first gate contact area extending from the second section of the first trench; and
   a second gate contact area disposed in the peripheral area opposite to the first gate contact area, the second gate contact area extending from the second section of the second trench.

2. The semiconductor device of claim 1, wherein a gate electrode in the first trench or a gate electrode in the second trench is electrically connected to the source metal layer instead of a gate potential.

3. The semiconductor device of claim 1, wherein the source metal layer extends over the first gate contact area and a gate electrode in the first trench is electrically connected to the source metal layer, or wherein the source metal layer extends over the second gate contact area and a gate electrode in the second trench is electrically connected to the source metal layer.

4. The semiconductor device of claim 1, further comprising:
a first gate metal layer disposed over and electrically connected to the first gate contact area; and
a second gate metal layer disposed over and electrically connected to the second gate contact area.

5. The semiconductor device of claim 4, wherein a field plate in the first trench is electrically connected to the first gate metal layer, and wherein a field plate in the second trench is electrically connected to the second gate metal layer.

6. The semiconductor device of claim 4, wherein a field plate in the first trench and a field plate in the second trench are electrically connected to the source metal layer.

7. The semiconductor device of claim 4, wherein the first gate metal layer is configured to provide a first gate potential to a gate electrode in the first trench, wherein the second gate metal layer is configured to provide a second gate potential to a gate electrode in the second trench, and wherein the first gate potential is independent of the second gate potential.

8. The semiconductor device of claim 7, wherein a field plate in the first trench is electrically connected to the first gate potential through one or more contacts connecting the first gate metal layer to the field plate in the first trench, and wherein a field plate in the second trench is electrically connected to the second gate potential through one or more contacts connecting the second gate metal layer to the field plate in the second trench.

9. The semiconductor device of claim 4, wherein a field plate in at least one of the first and second trenches is electrically connected to the gate potential instead of a source potential.

10. The semiconductor device of claim 1, wherein a gate electrode in the first trench is interrupted in at least one of the first sections of the first trench before reaching the second section of the first trench and is separated from the second section of the first trench by a dielectric material, and wherein the part of the gate electrode that is interrupted in at least one of the first sections of the first trench is electrically connected to the source metal layer to form a MOS gated-diode.

11. The semiconductor device of claim 1, wherein a gate electrode in the second trench is interrupted in at least one of the first sections of the second trench before reaching the second section of the second trench and is separated from the second section of the second trench by a dielectric material, and wherein the part of the gate electrode that is interrupted in at least one of the first sections of the second trench is electrically connected to the source metal layer to form a MOS gated-diode.

12. The semiconductor device of claim 1, wherein at least one of the first sections of the first trench terminates before reaching the second section of the first trench and is separated from the second section of the first trench by the semiconductor mesa, and wherein a gate electrode in the at least one of the first sections of the first trench that terminates before reaching the second section of the first trench is electrically connected to the source metal layer to form a MOS gated-diode.

13. The semiconductor device of claim 1, wherein at least one of the first sections of the second trench terminates before reaching the second section of the second trench and is separated from the second section of the second trench by the semiconductor mesa, and wherein a gate electrode in the at least one of the first sections of the second trench that terminates before reaching the second section of the second trench is electrically connected to the source metal layer to form a MOS gated-diode.

14. The semiconductor device of claim 1, further comprising:
a plurality of vertical transistor cells arranged adjacent to the first sections of the first trench and the first sections of the second trench, each of the plurality of vertical transistor cells comprising a source region arranged at the first main surface and a drain region arranged at a second main surface of the semiconductor substrate opposite the first main surface; and
a third trench surrounding the first trench and the second trench in the first main surface of the semiconductor substrate, the third trench isolating the source regions of the plurality of vertical transistor cells from source regions of an adjacent device.

15. The semiconductor device of claim 14, wherein the plurality of vertical transistor cells and the adjacent device are electrically connected to the same gate potential and drain potential.

16. A method of manufacturing a semiconductor device, the method comprising:
forming a first trench and a second trench in a first main surface of a semiconductor substrate and separated from each other by a semiconductor mesa, each of the first and second trenches comprising first sections extending lengthwise in a first direction and a second section extending lengthwise in a second direction transverse to the first direction, the second section of the first trench being disposed opposite to the second section of the second trench;
forming a source metal layer above the first main surface of the semiconductor substrate, the source metal layer being electrically connected to source regions in the semiconductor mesa;
electrically connecting a gate electrode in the first trench or a gate electrode in the second trench to the source metal layer instead of a gate potential;
forming a first gate contact area in a peripheral area outside a cell array defined by the first trench and the second trench, the first gate contact area extending from the second section of the first trench; and
forming a second gate contact area in the peripheral area opposite to the first gate contact area, the second gate contact area extending from the second section of the second trench.

17. A semiconductor device, comprising:
a first trench and a second trench in a first main surface of a semiconductor substrate, each of the first and second trenches comprising first sections extending lengthwise in a first direction and a second section extending lengthwise in a second direction transverse to the first direction, the second section of the first trench being disposed opposite to the second section of the second trench;
a semiconductor mesa separating the first and second trenches; and
a source metal layer above the first main surface of the semiconductor substrate and electrically connected to source regions in the semiconductor mesa,
wherein:
a gate electrode in the first trench is interrupted in at least one of the first sections of the first trench before reaching the second section of the first trench and is separated from the second section of the first trench by a dielectric material, and the part of the gate electrode that is interrupted in at least one of the first sections of the first trench is electrically connected to the source metal layer to form a MOS gated-diode; or at least one of the first sections of the first trench terminates before reaching the second section of the first trench and is separated from the second section of the first trench by the semiconductor mesa, and a gate electrode in the at least one of the first sections of the first trench that terminates before reaching the second section of the first trench is electrically connected to the source metal layer to form a MOS gated-diode; or at least one of the first sections of the second trench terminates before reaching the second section of the second trench and is separated from the second section of the second trench by the semiconductor mesa, and a gate electrode in the at least one of the first sections of the second trench that terminates before reaching the second section of the second trench is electrically connected to the source metal layer to form a MOS gated-diode.

18. A semiconductor device, comprising:

a first trench and a second trench in a first main surface of a semiconductor substrate, each of the first and second trenches comprising first sections extending lengthwise in a first direction and a second section extending lengthwise in a second direction transverse to the first direction, the second section of the first trench being disposed opposite to the second section of the second trench;

a semiconductor mesa separating the first and second trenches;

a source metal layer above the first main surface of the semiconductor substrate and electrically connected to source regions in the semiconductor mesa;

a plurality of vertical transistor cells arranged adjacent to the first sections of the first trench and the first sections of the second trench, each of the plurality of vertical transistor cells comprising a source region arranged at the first main surface and a drain region arranged at a second main surface of the semiconductor substrate opposite the first main surface; and a third trench surrounding the first trench and the second trench in the first main surface of the semiconductor substrate, the third trench isolating the source regions of the plurality of vertical transistor cells from source regions of an adjacent device.

19. The semiconductor device of claim 18, wherein the plurality of vertical transistor cells and the adjacent device are electrically connected to the same gate potential and drain potential.

* * * * *